United States Patent
Makita et al.

(10) Patent No.: US 9,842,836 B2
(45) Date of Patent: Dec. 12, 2017

(54) DIODE

(71) Applicant: ROHM CO., LTD., Kyoto (JP)

(72) Inventors: Kohei Makita, Kyoto (JP); Teruhiro Koshiba, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/097,933

(22) Filed: Apr. 13, 2016

(65) Prior Publication Data

US 2016/0307893 A1 Oct. 20, 2016

(30) Foreign Application Priority Data

Apr. 14, 2015 (JP) ................................. 2015-082797
Jul. 9, 2015 (JP) ................................. 2015-138030
Mar. 28, 2016 (JP) ................................. 2016-064131

(51) Int. Cl.
*H01L 29/66* (2006.01)
*H01L 27/08* (2006.01)
*H01L 29/872* (2006.01)
*H01L 29/866* (2006.01)
*H01L 29/36* (2006.01)
*H01L 29/47* (2006.01)
*H01L 29/06* (2006.01)

(52) U.S. Cl.
CPC .......... *H01L 27/0814* (2013.01); *H01L 29/36* (2013.01); *H01L 29/866* (2013.01); *H01L 29/872* (2013.01); *H01L 29/0619* (2013.01); *H01L 29/47* (2013.01)

(58) Field of Classification Search
USPC ........................................................ 257/481
See application file for complete search history.

(56) References Cited

U.S. PATENT DOCUMENTS

| 4,484,206 | A | * | 11/1984 | Moroshima | ........... | H01L 29/866 257/606 |
| 5,338,964 | A | * | 8/1994 | Bernier | ............... | H01L 27/0248 257/355 |
| 6,583,485 | B2 | * | 6/2003 | Epke | ..................... | H01L 29/872 257/471 |
| 2001/0042862 | A1 | * | 11/2001 | Epke | ..................... | H01L 29/872 257/54 |
| 2013/0140584 | A1 | * | 6/2013 | Kameshiro | ........... | H01L 29/861 257/77 |

(Continued)

FOREIGN PATENT DOCUMENTS

JP 2011-234614 A 11/2011

*Primary Examiner* — Telly Green
(74) *Attorney, Agent, or Firm* — Rabin & Berdo, P.C.

(57) ABSTRACT

A diode according to the present invention includes a semiconductor layer of a first conductivity type having an impurity concentration of $1\times10^{16}$ cm$^{-3}$ to $2.4\times10^{17}$ cm$^{-3}$, a Zener diode region of a second conductivity type formed selectively in the semiconductor layer and forming a pn junction with the semiconductor layer, a Schottky metal disposed on the semiconductor layer, forming a Schottky junction with the semiconductor layer, and having a work function of 3 eV to 6 eV, and a JBS (junction barrier Schottky) structure including a plurality of second conductivity type regions formed selectively in the Schottky junction region of the semiconductor layer.

28 Claims, 23 Drawing Sheets

(56) References Cited

U.S. PATENT DOCUMENTS

2014/0117487 A1* 5/2014 Nagai ................. H01L 29/0619
                                                   257/471
2015/0137135 A1* 5/2015 Green ................... H01L 29/872
                                                    257/76

* cited by examiner

| Structure | VF IF=100A | IR VR=18V | VZ IZ=100mA |
|---|---|---|---|
| 1st Sample Double Epi structure | △ 0.81V typ. | ◎ 0.85μA typ. | ◎ 22V typ. |
| Target | 0.70V typ. | 5μA max. | 21~25V |

| Structure | VF<br>IF=100A | IR<br>VR=18V | VZ<br>IZ=100mA |
|---|---|---|---|
| 1st Sample<br>Double Epi structure | △<br>0.81V typ. | ◎<br>0.85 μA typ. | ◎<br>22V typ. |
| Improved Simulation<br>Double Epi structure<br>Epi thickness reduced<br>(5 μm) | ○<br>0.76V typ. | ◎<br>0.85 μA typ. | ◎<br>22V typ. |
| Target | 0.70V typ. | 5 μA max. | 21~25V |

DIODE

CROSS-REFERENCE TO RELATED APPLICATIONS

The present application corresponds to Japanese Patent Application No. 2015-82797 filed in the Japan Patent Office on Apr. 14, 2015, Japanese Patent Application No. 2015-138030 filed in the Japan Patent Office on Jul. 9, 2015, Japanese Patent Application No. 2016-64131 filed in the Japan Patent Office on Mar. 28, 2016, and all the disclosures of the applications will be incorporated herein by citation.

TECHNICAL FIELD

The present invention relates to a Schottky barrier diode having a Zener diode incorporated therein.

BACKGROUND ART

With an alternator (AC generator) installed in an automobile or motorcycle, etc., an alternating current generated in a coil is rectified by a diode and taken out as a direct current. A Zener diode, Schottky barrier diode, etc., are known as examples of the rectifying element used (for example, Patent Document 1 (Japanese Patent Application Publication No. 2011-234614)).

SUMMARY OF INVENTION

In recent years, it is desired to improve the fuel consumption of internal combustion engines to reduce emission gases in accordance with automobile emission gas regulations. There is a possibility that improvement of efficiency of an alternator that is driven in linkage with the rotation of an internal combustion engine may contribute to improvement of the fuel consumption of the internal combustion engine.

A embodiment of the present invention provides a diode, which, while having a sufficient load dump tolerance due to including a Zener diode region, is capable of realizing a low forward voltage (low VF) and a low reverse leakage current (low IR) in comparison to conventional arts.

DESCRIPTION OF EMBODIMENTS

Figure 1:
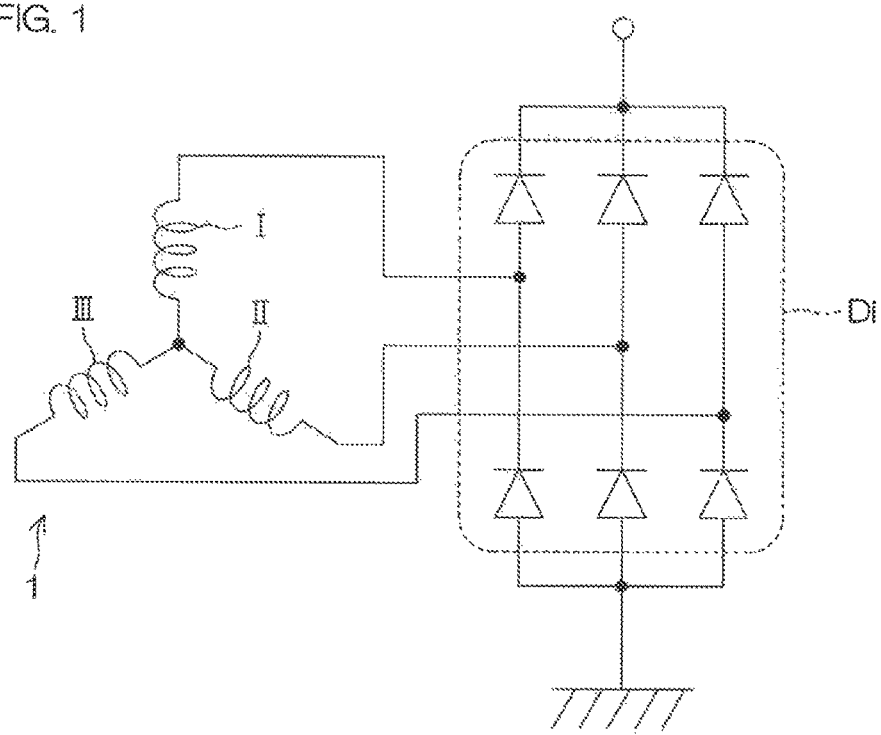
FIG. 1 is a circuit diagram of an alternator.

A embodiment of the present invention provides a diode that includes a semiconductor layer of a first conductivity type having an impurity concentration of $1\times10^{16}$ cm$^{-3}$ to $2.4\times10^{17}$ cm$^{-3}$, a Zener diode region of a second conductivity type formed selectively in the semiconductor layer and forming a pn junction with the semiconductor layer, a Schottky metal disposed on the semiconductor layer, forming a Schottky junction with the semiconductor layer, and having a work function of 3 eV to 6 eV, and a JBS (junction barrier Schottky) structure including a plurality of second conductivity type regions formed selectively in the Schottky junction region of the semiconductor layer.

A embodiment of the present invention provides a diode that includes a semiconductor layer of a first conductivity type having a specific resistance of 50 mΩ·cm to 500 mΩ·cm, a Zener diode region of a second conductivity type formed selectively in the semiconductor layer and forming a pn junction with the semiconductor layer, a Schottky metal disposed on the semiconductor layer, forming a Schottky junction with the semiconductor layer, and having a work function of 3 eV to 6 eV, and a JBS (junction barrier Schottky) structure including a plurality of second conductivity type regions formed selectively in the Schottky junction region of the semiconductor layer.

In a embodiment of the present invention, the impurity concentration of the semiconductor layer is, for example, $1\times10^{16}$ cm$^{-3}$ to $2.4\times10^{17}$ cm$^{-3}$, more preferably $1.8\times10^{16}$ cm$^3$ to $2.4\times10^{17}$ cm$^{-3}$, and even more preferably $1.8\times10^{16}$ cm$^{-3}$ to $8.0\times10^{16}$ cm$^{-3}$.

In a embodiment of the present invention, the specific resistance of the semiconductor layer is, for example, 50 mΩ·cm to 500 mΩ·cm, more preferably 50 mΩ·cm to 300 mΩ·cm, and even more preferably 100 mΩ·cm to 300 mΩ·cm.

In a embodiment of the present invention, the work function of the Schottky metal is, for example, 3 eV to 6 eV, more preferably 4 eV to 6 eV, even more preferably 5 eV to 6 eV, and especially preferably 5.3 eV to 6 eV.

In a embodiment of the present invention, the Schottky metal includes of Pt or Mo.

In a embodiment of the present invention, the semiconductor layer has a thickness, for example, of 2 μm to 10 μm, more preferably 2 μm to 6 μm, and even more preferably 2.5 μm to 5 μm.

In a embodiment of the present invention, each of the second conductivity type regions has a width W1 of, for example, 0.1 μm to 10 μm, more preferably 1 μm to 5 μm, and even more preferably 1 μm to 2 μm.

In a embodiment of the present invention, the plurality of second conductivity type regions are arrayed at a pitch P1 of, for example, 2 μm to 5 μm, more preferably 2.5 μm to 4.5 μm, and even more preferably 3 μm to 4 μm.

In a embodiment of the present invention, the plurality of second conductivity type regions are arrayed so that there is a distance D1 of 0.1 μm to 6 μm between mutually adjacent second conductivity type regions.

In a embodiment of the present invention, the plurality of second conductivity type regions have a regularity of a regular hexagonal array.

In a embodiment of the present invention, the plurality of second conductivity type regions have the same depth as the Zener diode region.

In a embodiment of the present invention, the Zener diode region has an impurity concentration of $1\times10^{16}$ cm$^{-3}$ to $1\times10^{20}$ cm$^{-3}$.

In a embodiment of the present invention, the Schottky metal includes Pt.

In a embodiment of the present invention, the Schottky metal includes a Pt silicide layer or a Pt silicide layer and a Pt layer on the Pt silicide layer.

A embodiment of the present invention further includes a contact metal disposed on the Schottky metal.

A embodiment of the present invention further includes an intermediate metal layer disposed between the Schottky metal and the contact metal and including Mo, Ti, V, Cr, Zr, or Ta.

A embodiment according to the invention of the present application shall now be described in detail with reference to the attached drawings.

<Use and Required Specifications of the Diode>

FIG. 1 is a circuit diagram of an alternator 1. The invention according to the present application may be used as each of diodes Di of the circuit of the alternator 1 in FIG. 1. The six diodes Di are connected to the respective stator coils I to III of the alternator 1 and perform full wave rectification of a three-phase alternating current generated in the stator coils I to III.

To make the alternator 1 high in efficiency and improve its reliability, low forward voltage (low VF), low reverse leakage current (low IR), etc., are required of the diodes Di used. As characteristics of a Zener-incorporated Schottky barrier diode according to the present application, the inventors of the present application set target values of VF: 0.65V typ. (IF=100 A), IR: 5 μA max. (VR=18V), VZ: 21V to 25V (IZ=100 mA), and HIR (high-temperature reverse leakage current): 25 mA max. (VR=18V), and realized characteristics close to the target values by the arrangement described below.

Figure 2:
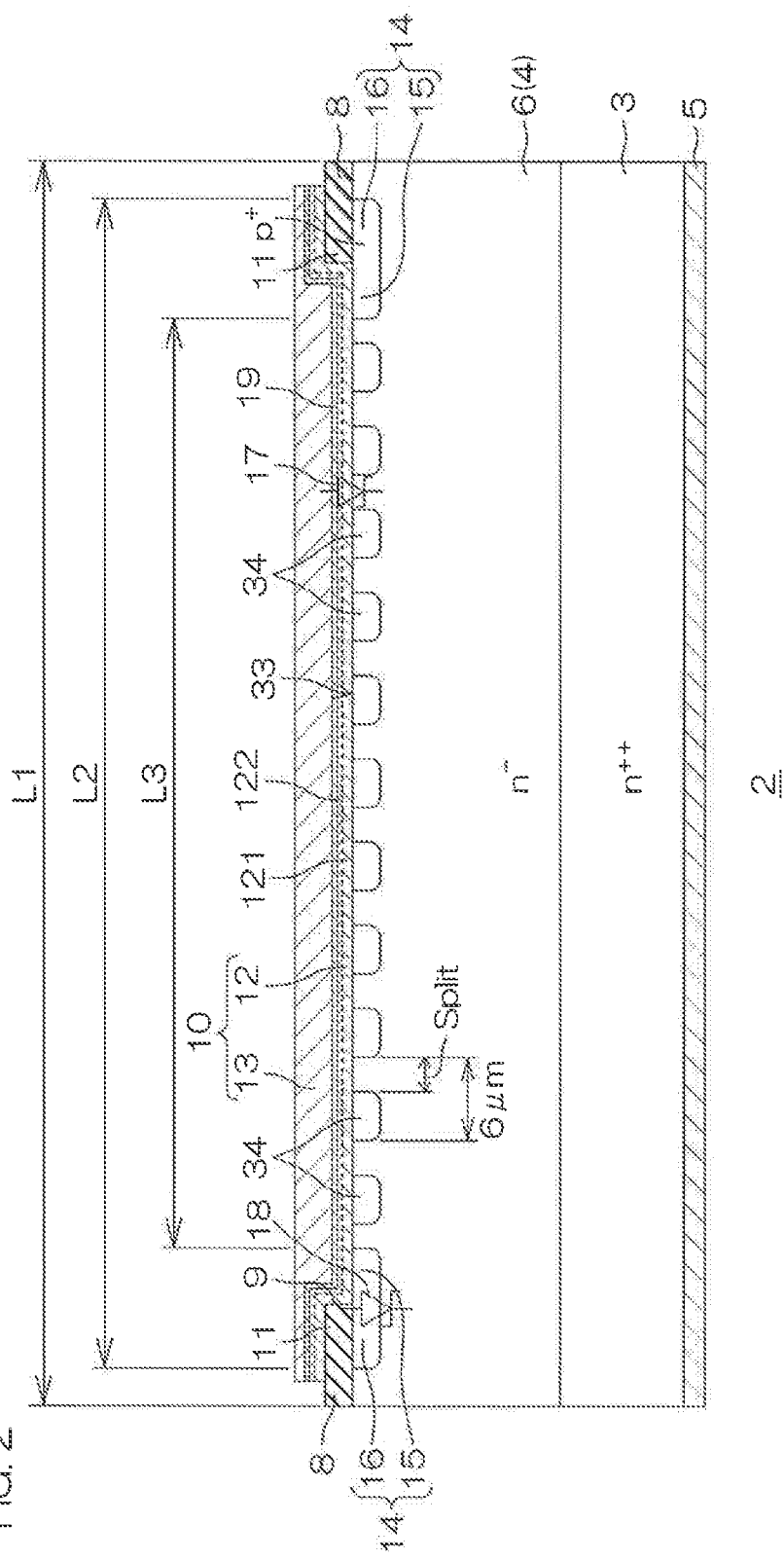
FIG. 2 is a schematic sectional view of a diode having a JBS structure according to the present invention.

FIG. 2 is a schematic sectional view for describing the arrangement of a diode 2 according to a embodiment of the present invention.

The diode 2 has, for example, a shape of a chip that is square in plan view. The chip-shaped diode 2 has a size (L1 square=L1×L1) of, for example, 2 mm square to 10 mm square. Specifically, it may be approximately 5 mm square.

The diode 2 has an n$^{++}$ type silicon substrate 3 and an epitaxial layer 4, constituted of silicon, as an example of a semiconductor layer laminated on the n$^{++}$ type silicon substrate 3. On a rear surface of the n$^{++}$ type silicon substrate 3, a cathode electrode 5 is formed so as to cover its entirety. The cathode electrode 5 is constituted of a metal (for example, Al, Au, Ni, Ti, Pd, etc.) that is capable of being in ohmic contact with n$^{++}$ type silicon.

The n$^{++}$ type silicon substrate 3 has an impurity concentration of, for example, $1\times10^{19}$ cm$^{-3}$ to $1\times10^{21}$ cm$^{-3}$. Also, the n$^{++}$ type silicon substrate 3 has a thickness of, for example, 50 μm to 300 μm.

The epitaxial layer 4 includes an n$^-$ type layer 6 formed on a front surface of the n$^{++}$ type silicon substrate 3. In the present embodiment, the epitaxial layer 4 is constituted of the n$^-$ type layer 6 and the n$^-$ type layer 6 forms a front surface of the epitaxial layer 4.

An impurity concentration of the n$^-$ type layer 6 is, for example, $1\times10^6$ cm$^{-3}$ to $2.4\times10^{17}$ cm$^{-3}$. More preferably, it is $1.8\times10^{16}$ cm$^{-3}$ to $2.4\times10^{17}$ cm$^{-3}$ and even more preferably, it is $1.8\times10^{16}$ cm$^{-3}$ to $8.0\times10^{16}$ cm$^{-3}$. As a specific value, the impurity concentration of the n$^-$ type layer 6 may, for example, be approximately $3.0\times10^{16}$ cm$^{-3}$.

Also, by the above, a specific resistance of the n$^-$ type layer 6 is, for example, 50 mΩ·cm to 500 mΩ·cm, more preferably 50 mΩ·cm to 300 mΩ·cm, and even more preferably 100 mΩ·cm to 300 mΩ·cm. As a specific value, the specific resistance of the n$^-$ type layer 6 may, for example, be approximately 300 mΩ·cm.

Also, a thickness of the n$^-$ type layer 6 (epitaxial layer 4) is, for example, 2 μm to 10 μm, more preferably 2 μm to 6 μm, and even more preferably 2.5 μm to 5 μm. Specifically, it may be approximately 4 μm.

A silicon oxide (SiO$_2$) field insulating film 8 is formed on the front surface of the epitaxial layer 4. The field insulating film 8 has a thickness of, for example, 1000 Å to 10000 Å. The field insulating film 8 may be constituted of another insulating material, such as silicon nitride (SiN), etc. An opening 9 exposing a central portion of the epitaxial layer 4 is formed in the field insulating film 8. An anode electrode 10 is formed on the field insulating film 8.

The anode electrode 10 fills the interior of the opening 9 in the field insulating film 8 completely and protrudes flange-like to an outer side of the opening 9 so as to cover from above, a peripheral edge portion 11 of the field insulating film 8 along the opening 9. That is, the peripheral edge portion 11 of the field insulating film 8 is sandwiched, along its entire periphery, from the respective upper and lower sides by the epitaxial layer 4 and the anode electrode 10.

The anode electrode 10 has a two-layer structure of a Schottky metal 12, joined to the epitaxial layer 4 (n$^-$ type layer 6) inside the opening 9 in the field insulating film 8, and a contact metal 13 laminated on the Schottky metal 12.

The Schottky metal 12 is a metal that forms a Schottky junction by being joined to the n$^-$ type layer 6 and it is further preferable to use a barrier metal material of greater Schottky barrier height (Φb: work function) than the conventionally used Mo or Ni. In the present embodiment, the Schottky metal 12 may be constituted of a metal having a work function of 3 eV to 6 eV. The work function of the Schottky metal 12 is more preferably 4 eV to 6 eV, even more preferably 5 eV to 6 eV, and especially preferably 5.3 eV to 6 eV. Experimentally, the above work functions are obtained, for example, by the Kelvin method (vibrating capacitance method) or by measuring the energy of thermionic emission or photoelectric emission. Specifically, as the specific metal used in the Schottky metal 12, although, for example, Ir (5.3 eV) or Pt (5.65 eV) is preferable, Mo (4.45 eV) may also be used. That is, if an epitaxial layer 4 having an impurity concentration of $1 \times 10^{16}$ $cm^{-3}$ to $2.4 \times 10^{17}$ $cm^{-3}$ is adopted as in the present embodiment, it is preferable to use a metal of high work function, such as Ir or Pt, as the Schottky metal.

Also, the Schottky metal 12 may be formed entirely as a Pt layer or a Pt silicide layer or, for example as defined by broken lines in FIG. 2, may be in a state where a Pt layer 122 remains on top of a Pt silicide layer 121. If the Schottky metal 12 is formed as a Pt silicide layer, a Pt layer is not present as a metal film and therefore, there are no problems in terms of close adhesion, etc., and an effect of preventing peeling of the Schottky metal 12 can be anticipated.

An intermediate metal layer 19, constituted of Mo, Ti, V, Cr, Zr, or Ta, may be included on the Schottky metal 12. If a Pt or Pt silicide layer is used in the Schottky metal 12, Mo is preferably used in the intermediate metal layer 19. In this case, a thickness of the intermediate metal layer 19 may be made comparatively thin, for example, approximately 350 Å.

The contact metal 13 is the portion of the anode electrode 10 that is exposed at the frontmost surface of the diode 2 and to which a bonding wire, etc., is bonded. The contact metal 13 is constituted, for example, of metals including Al, Ag, etc. Specifically, it may be constituted of Mo/Ti/Al/Ti/Ni/Ag (with Mo being at the Schottky metal 12 side), etc. The contact metal 13 is greater in thickness than the Schottky metal 12. In the present embodiment, the contact metal 13 is constituted of an Ag-based solder material and can be used favorably in a case where the diode 2 is mounted inside a package.

Also, although unillustrated, a passivation film may be formed on the frontmost surface of the diode 2 and an opening exposing the contact metal 13 may be formed in a central portion of the passivation film. A bonding wire, etc., is bonded to the contact metal 13 via the opening.

A $p^+$ type Zener diode region 14 is formed in the epitaxial layer 4 so as to be in contact with the Schottky metal 12. The $p^+$ type Zener diode region 14 is formed to an annular shape along a contour of the opening 9 in the field insulating film 8 and extends between the inside and the outside of the opening 9. The $p^+$ type Zener diode region 14 thus includes an inner portion 15, protruding to the inside of the opening 9 and contacting a terminal portion of the Schottky metal 12 inside the opening 9, and an outer portion 16, protruding to the outside of the opening 9 and facing the Schottky metal 12 across the peripheral edge portion 11 of the field insulating film 8. An outer edge of the outer portion 16 is set to be further inward than an outer edge of the Schottky metal 12. In the present embodiment, for example, if L1 of the size (L1×L1) of the diode 2 is 4.84 mm, an outer diameter L2 of the $p^+$ type Zener diode region 14 is, for example, 4.76 mm and an inner diameter L3 is, for example, 4.60 mm.

A structure such as the $p^+$ type Zener diode region 14 may be formed, for example, by epitaxially growing the n type layer 6 on the $n^{++}$ type silicon substrate 3 and thereafter implanting and diffusing a p type impurity at a comparatively high energy in the epitaxial layer 4. A depth of the $p^+$ type Zener diode region 14 is, for example, 0.5 µm to 10 µm, more preferably 0.5 to 5 µm, and even more preferably 1 µm to 3.5 µm. Specifically, it may be approximately 1 µm. Also, an impurity concentration of the $p^+$ type Zener diode region 14 is, for example, $1 \times 10^{16}$ $cm^{-3}$ to $1 \times 10^{20}$ $cm^{-3}$.

With the diode 2, a Schottky barrier is formed between the Schottky metal 12 and the $n^-$ type layer 6 to arrange a Schottky barrier diode 17 (Schottky Diode). On the other hand, a pn junction is formed between the $p^+$ type Zener diode region 14 and the $n^-$ type layer 6 to arrange a Zener diode 18 (Zener Di).

With the diode 2, a plurality of $p^+$ type regions 34 are discretely disposed in a central region of the $n^-$ type layer 6 (epitaxial layer 4) surrounded by the $p^+$ type Zener diode region 14. A JBS structure 33 is thereby arranged.

Figure 3:
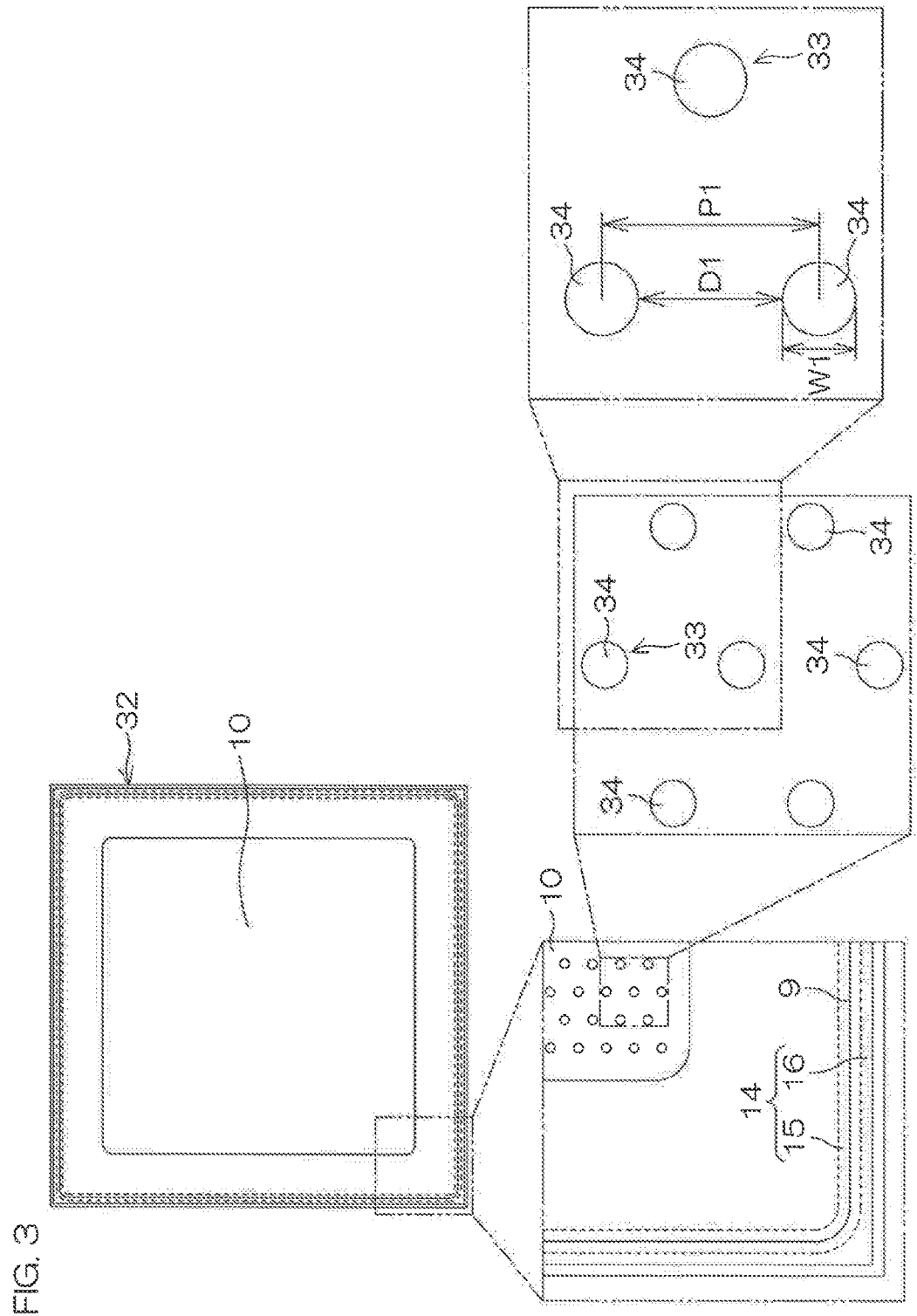
FIG. 3 is a plan view for describing a positional configuration of p$^+$ type regions of the diode of FIG. 2.

FIG. 3 is a plan view for describing a positional configuration of the $p^+$ type regions 34. Elements mutually corresponding to those of FIG. 2 are indicated with the same reference symbols.

The plurality of $p^+$ type regions 34 may have a regularity of a regular hexagonal array as shown in FIG. 3 or may have a regularity of a matrix array. An array configuration of the plurality of $p^+$ type regions 34 is not restricted to the above and may be a regular staggered array or does not have to have regularity.

Also, the plurality of $p^+$ type regions 34 may be formed shallower than or may be formed deeper than the $p^+$ type Zener diode region 14. Also as shown in FIG. 2, the plurality of $p^+$ type regions 34 and the $p^+$ type Zener diode region 14 may be the same in depth. If the regions 14 and 34 are the same in depth, the regions 14 and 34 can be formed in the same process and manufacturing efficiency is good.

Also, each $p^+$ type region 34 has a width (diameter) W1 of, for example, 0.1 µm to 10 µm, more preferably 1 µm to 5 µm, and even more preferably 1 µm to 2 µm. Specifically, it may be approximately 1.0 µm.

A pitch P1 of the plurality of $p^+$ type regions 34 is an interval (cell interval) between centers of mutually adjacent cells when each $p^+$ type regions 34 is regard to be a single cell and is, for example, 2 µm to 5 µm, more preferably 2.5 µm to 4.5 µm, and even more preferably 3 µm to 4 µm. Specifically, it may be approximately 3.6 µm.

Also, a mutual distance D1 (distance between Xj) between peripheral edges of mutually adjacent $p^+$ type regions 34 that are set after the p type impurity have been implanted and diffused in the epitaxial layer 4 may, for example, be 0.1 µm to 6 µm.

Simulation and Experimental Examples

Results of simulations regarding the characteristics of the diode 2 shall now be described with reference to FIG. 2 and FIG. 3.

The $n^-$ type layer 6 of the diode 2 has a resistance value (specific resistance) that is not 0 and therefore, between the anode electrode 10 and the cathode electrode 5, it is a current carrying medium and at the same time constitutes mutually serially connected resistances R. Therefore, it is considered that the resistances R can be reduced by thinning the $n^-$ type layer 6.

The inventors of the present application thus evaluated by simulation what influence the thinning of the n type layer 6 may have on the characteristics of the diode 2. As simulation conditions, the thickness of the $n^-$ type layer 6 was set to 5 µm, 10 µm, 15 µm, 20 µm, and 25 µm. Also in the simulation, the JBS structure 33 was not taken into consideration.

Figure 4:
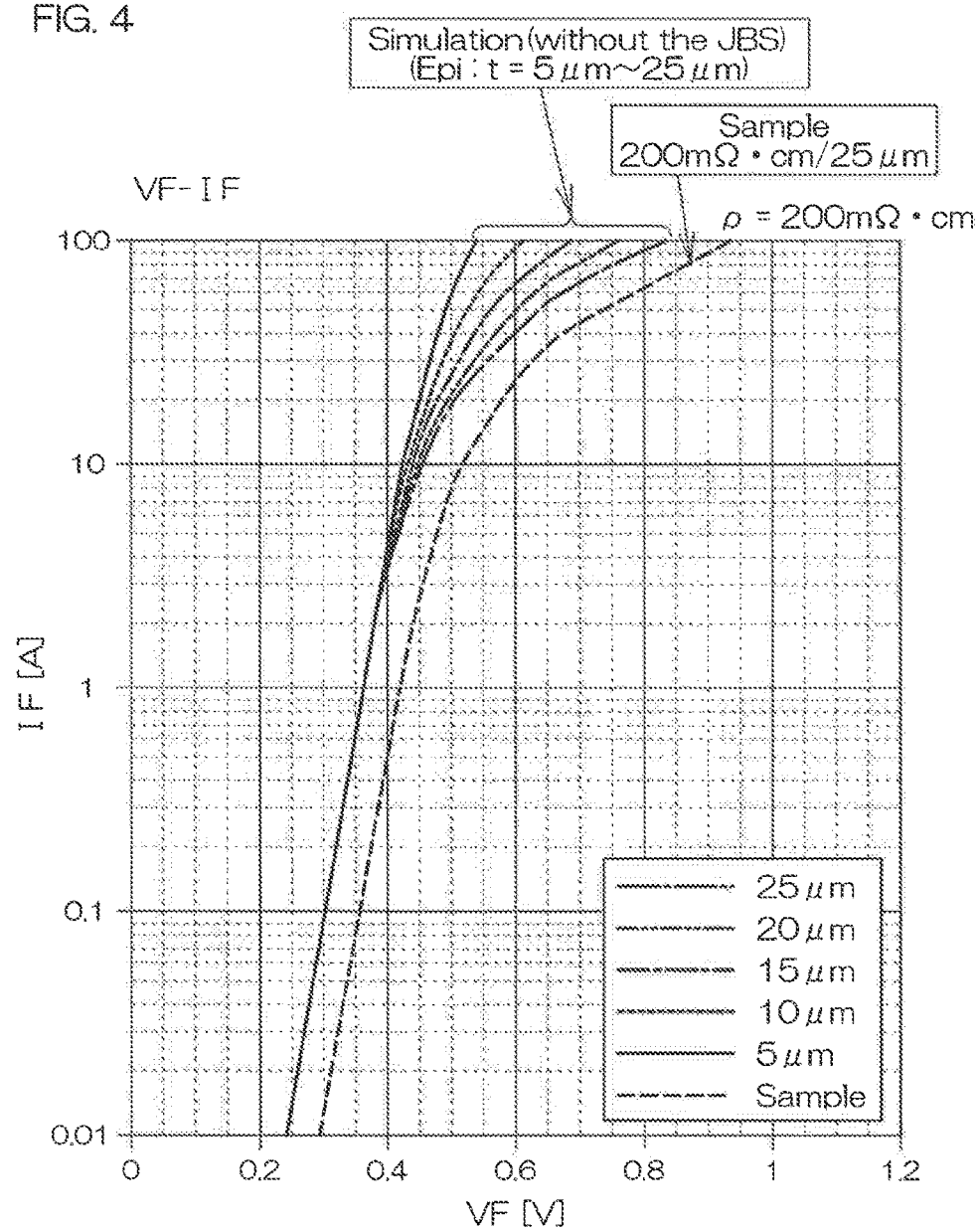
FIG. 4 is a graph showing simulation results of VF-IF characteristics of the diode of FIG. 2 according to epi thickness.

FIG. 4 is a graph showing simulation results of VF-IF characteristics of the diode 2 (without the JBS structure) of FIG. 2 according to epi thickness. In FIG. 4, the VF-IF characteristics (actual measurement values) of a sample (Sample) with n⁻ type layer 6: specific resistance 200 mΩ·cm, thickness 25 μm and Schottky metal 12: Pt are also shown for reference.

As shown in FIG. 4, it was found as a result of simulation that the smaller the thickness (epi thickness) of the n⁻ type layer 6, the lower the VF at IF=100 A.

To more clearly examine the relationship of the VF with the epi thickness prepared based on the simulation, the following results were obtained in regard to the relationship of the thickness of the n⁻ type layer 6 with the VF.

Thickness of the $n^-$ type layer 6=5 μm→VF=0.54V typ.

Thickness of the $n^-$ type layer 6=10 μm→VF=0.61V typ.

Thickness of the $n^-$ type layer 6=15 μm→VF=0.68V typ.

Thickness of the $n^-$ type layer 6=20 μm→VF=0.75V typ.

Thickness of the $n^-$ type layer 6=25 μm→VF=0.82V typ.

Here, the thickness of 25 μm is the thickness of the n⁻ type layer 6 of an actual sample (not a simulation) and therefore the difference between the actual measurement value (0.92V typ.) and the simulation value (0.82V typ.) of the VF for the thickness of 25 μm is determined as 0.10V typ. When the simulation results for 5 μm, 10 μm, 15 μm, and 20 μm are corrected based on this difference, prediction values are calculated as follows:

Thickness of the $n^-$ type layer 6=5 μm→VF=0.64V typ. (prediction value)

Thickness of the $n^-$ type layer 6=10 μm→VF=0.71V typ. (prediction value)

Thickness of the $n^-$ type layer 6=15 μm→VF=0.78V typ. (prediction value)

Thickness of the $n^-$ type layer 6=20 μm→VF=0.85V typ. (prediction value)

Thickness of the $n^-$ type layer 6=25 μm→VF=0.92V typ. (actual measurement value)

From the above, it is clear that VF=0.64V typ. (IF=100 A) can be achieved when the thickness of the n⁻ type layer 6 is set to 5 μm.

On the other hand, as a result of evaluating VR-IR characteristics (simulation), it was found that the IR does not change even if the n⁻ type layer 6 is thinned. Although the VR-IR characteristics obtained by the simulation (epi thickness=5 μm to 25 μm) meet the target value of 5 μA max. (VR=18V) set by the inventors of the present application, these are strictly simulation results and do not necessarily meet the target in actuality. As long as the simulation results indicate that the IR is substantially equivalent regardless of the thickness of the n⁻ type layer 6, it may be said that it is difficult to achieve the target value (5 μA max. (VR=18V)) in regard to the IR even if the actual n⁻ type layer 6 is thinned.

Simulation results in a case where the JBS structure 33 is introduced shall now be described.

Figure 5:
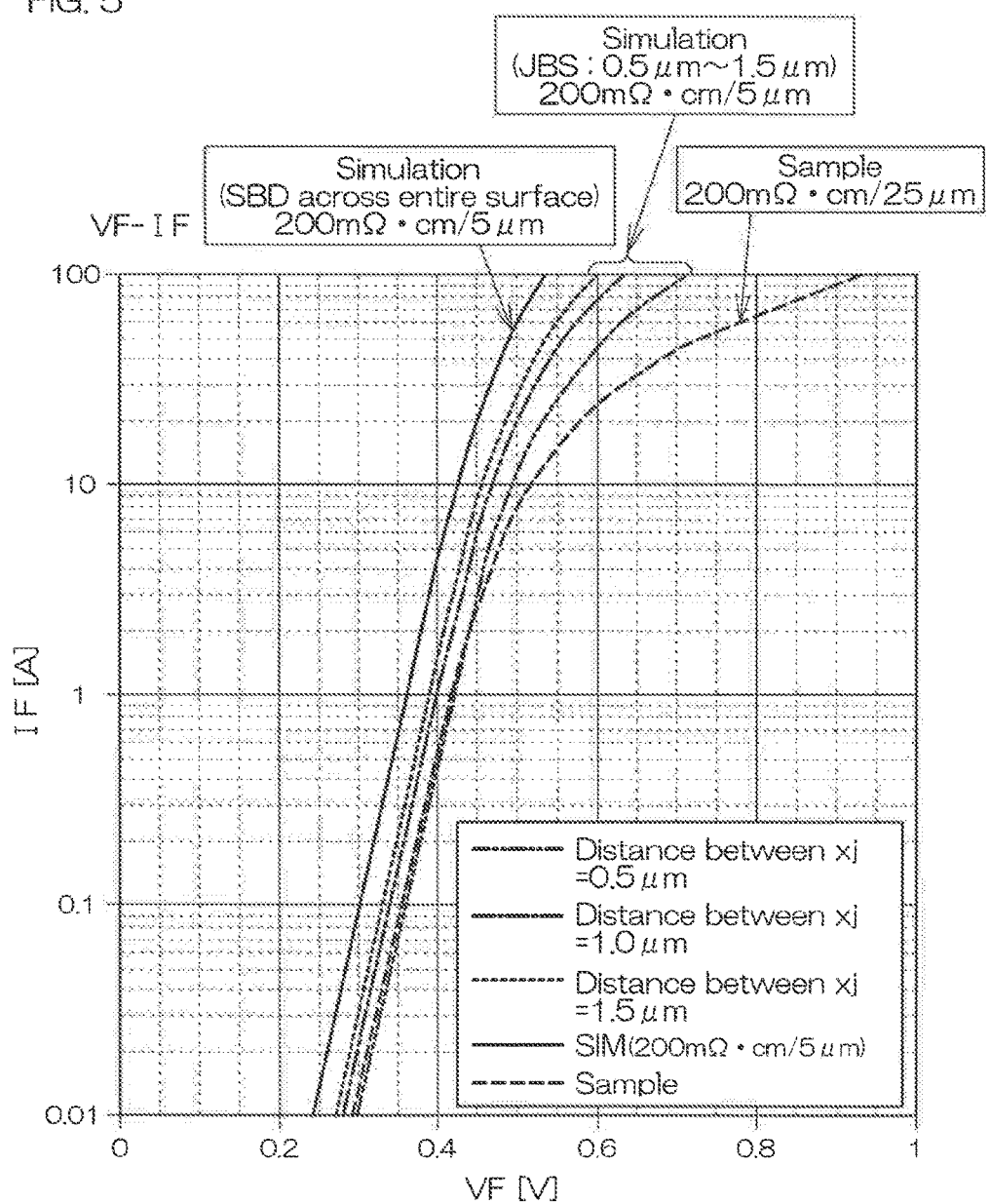
FIG. 5 is a graph showing simulation results (with epi thickness fixed) of VF-IF characteristics of the diode of FIG. 2 according to distance (distance between Xj) between mutually adjacent p$^+$ type regions.

FIG. 5 is a graph showing simulation results (with epi thickness fixed) of the VF-IF characteristics of the diode 2 (with the JBS structure) of FIG. 2 according to the distance D1 (distance between Xj) between mutually adjacent p⁺ type regions 34. In FIG. 5, the VF-IF characteristics of the simulation results (SIM) and the sample (actual measurement values) for the epi thickness of 5 μm in FIG. 4 are shown for reference.

The simulation was performed in accordance with the following conditions. That is, the JBS structure 33 was added to the structure, which, in the above simulation, realized VF=0.64V typ. that clears the target value of 0.65V typ. (IF=100 A), as a base.

n⁻ type layer 6: specific resistance 200 mΩ·cm, thickness 5.0 μm, Schottky metal 12: uses Pt JBS structure 33: cell pitch P1=4.3 μm, cell diameter W1=1.2 μm, distance D1 between Xj=0.5 μm to 1.5 μm As a result of evaluating the VF-IF characteristics obtained, it was found, as shown in FIG. 5, that if the thickness of the n⁻ type layer 6 is 5.0 μm, a VF lower in comparison to the case where the thickness of the n⁻ type layer 6 is 25.0 μm (Sample) can be realized even if the JBS structure 33 is formed in the n⁻ type layer 6 (distance between Xj=0.5 μm, 1.0 μm, 1.5 μm). Further, it was found that the greater the distance between Xj, the lower the VF at IF=100 A.

To more clearly examine the relationship of the VF with the distance D1 between Xj prepared based on the simulation, the following results were obtained in regard to the relationship of the VF with the distance D1 between Xj.

Distance D1 between $Xj$=0.5 μm→VF=0.71V typ.

Distance D1 between $Xj$=1.0 μm→VF=0.63V typ.

Distance D1 between $Xj$=1.5 μm→VF=0.60V typ.

Here, when the simulation results for 0.5 μm, 1.0 μm, and 1.5 μm are corrected based on the correction value, 0.10V typ., used in the evaluation of VF-IF characteristics of FIG. 4, prediction values are calculated as follows:

Distance D1 between $Xj$=0.5 μm→VF=0.81V typ. (prediction value)

Distance D1 between $Xj$=1.0 μm→VF=0.73V typ. (prediction value)

Distance D1 between $Xj$=1.5 μm→VF=0.70V typ. (prediction value)

From the above, it is clear that VF=0.70V typ. (IF=100 A), which is substantially equivalent to the target value, can be achieved when the thickness of the n⁻ type layer 6 is 5 μm and the distance D1 between Xj is 1.5 μm.

On the other hand, as a result of evaluating the VR-IR characteristics of the improved structure (with the JBS) of FIG. 5, it was found that the IR can be restricted greatly by the introduction of the JBS structure 33.

Thus, as a result of comparing the characteristics of the improved structure (with the JBS) and the characteristics of the actual structure and the characteristics of the other simulation structure (without the JBS) shown in FIG. 4, it was found that all target value items that could not be achieved with the sample and the other simulation structure could be achieved with the improved structure (with the JBS).

Respective characteristics of a specific experimental example of the diode 2 shall now be described. That is, a plurality of samples were prepared in accordance with the arrangement (with the JBS structure) of the diode 2 and the characteristics of the samples (Nos. 1 to 12) were evaluated. The following are the main conditions of the samples.

Cell diameter W1: 1.2 μm
Cell pitch P1: 3.8 μm/4.3 μm/4.8 μm
Cell positional configuration: Regular hexagonal array
Distance D1 between Xj: 0.3 μm/0.8 μm/1.3 μm The cell pitches P1 and the distances D1 between Xj indicate dimensions of the regions after implanting a p type impurity using a mask with an aperture dimension of 1.2 μm and thereafter diffusing the impurity by an annealing processing.

Results of evaluating the VF-IF characteristics and the VR-IR characteristics of the sample Nos. 1 to 12 show that among the sample Nos. 1 to 12, the sample with the epi thickness/cell pitch P1=4 μm/4.3 μm (No. 11) in particular can achieve a VF comparatively close to the target value of 0.65V typ. (IF=100 A). In regard to the IR, it was found that by the JBS structure 33, considerable improvement is achieved in comparison to the IR of the other simulation structure shown in FIG. 4.

Next, with the sample Nos. 1 to 12, relationships of the thickness of the epitaxial layer 4 (epi thickness) with the VF and the IR (results shown in FIG. 6 and FIG. 7), relationships of the cell pitch P1 with the VF (results shown in FIG. 8 and FIG. 9), a relationship of the specific resistance with BV (breakdown voltage) (results shown in FIG. 10), and a relationship of the VF with the IR (results shown in FIG. 11) were also evaluated.

Figure 6:
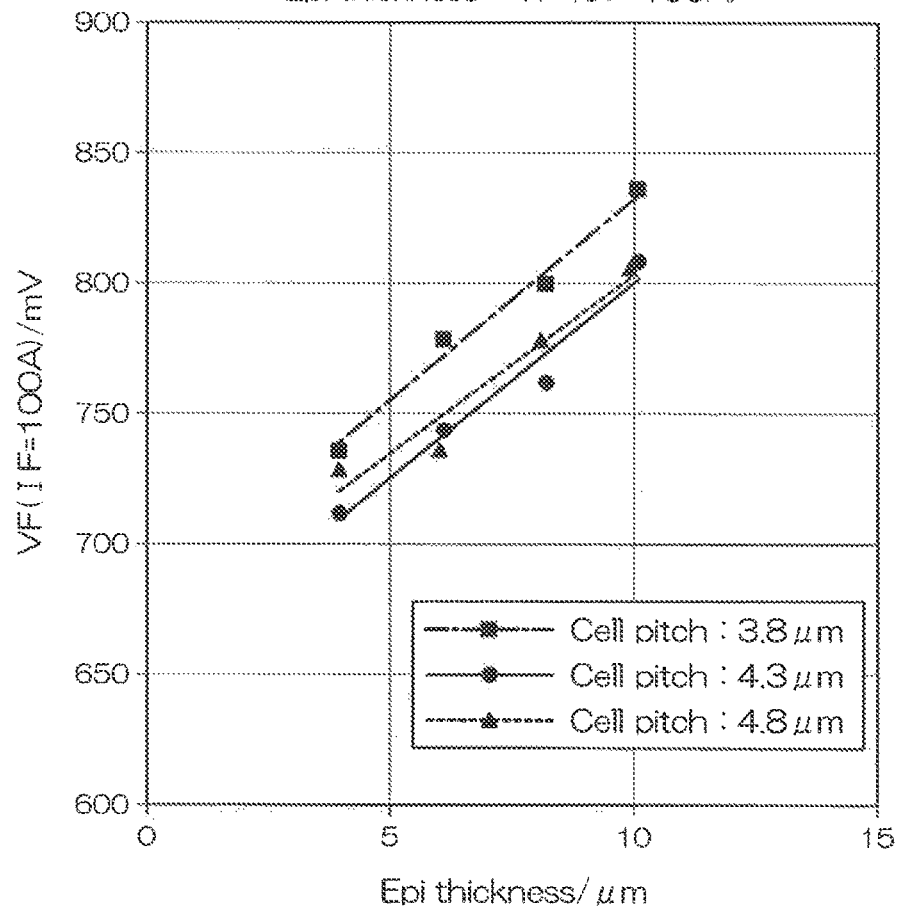
FIG. 6 is a graph showing a relationship of epi thickness with VF of the diode of FIG. 2 according to cell pitch.
Figure 7:
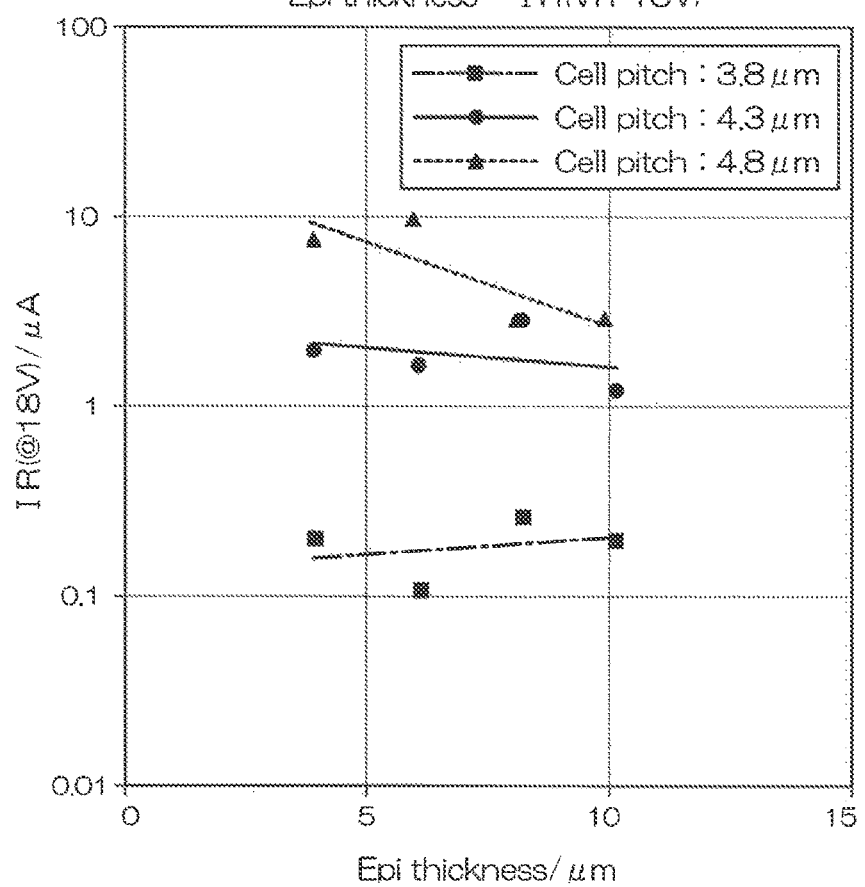
FIG. 7 is a graph showing a relationship of epi thickness with IR of the diode of FIG. 2 according to cell pitch.

From FIG. 6, it can be understood that as the epi thickness decreases, the VF decreases. On the other hand, in regard to the IR, it can be understood as shown in FIG. 7 that there is a tendency to increase with decrease of the epi thickness.

Figure 8:
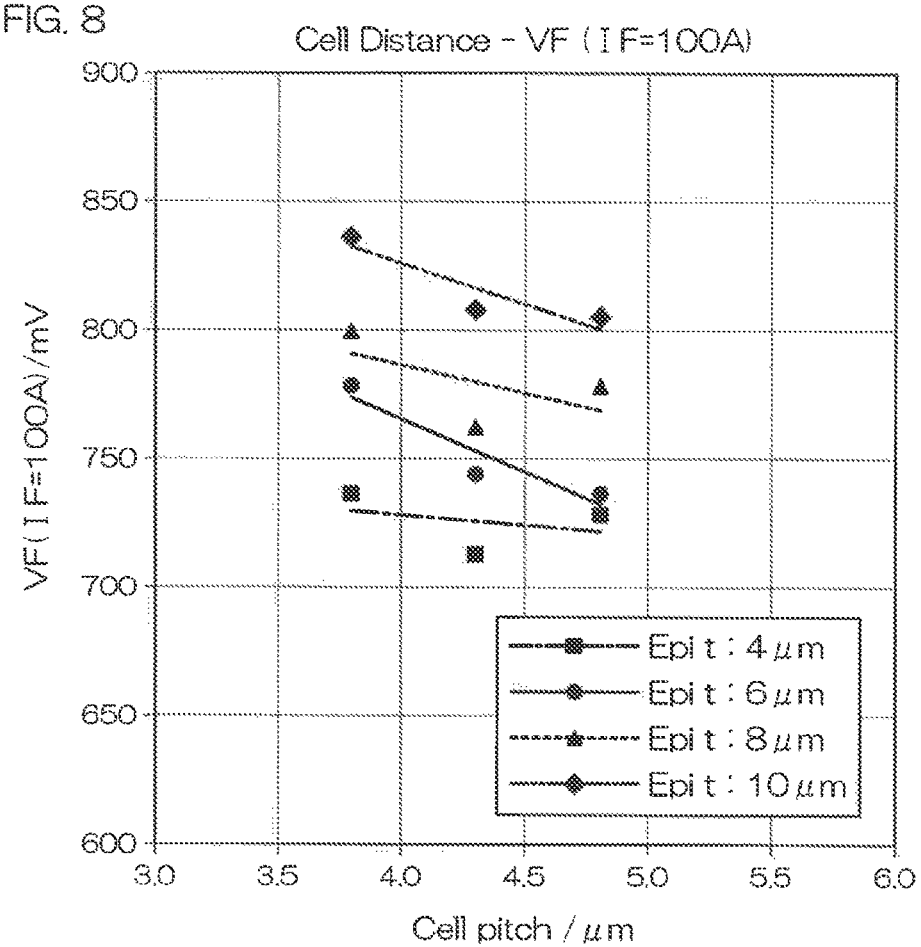
FIG. 8 is a graph showing a relationship of cell pitch with VF of the diode of FIG. 2 according to epi thickness.
Figure 9:
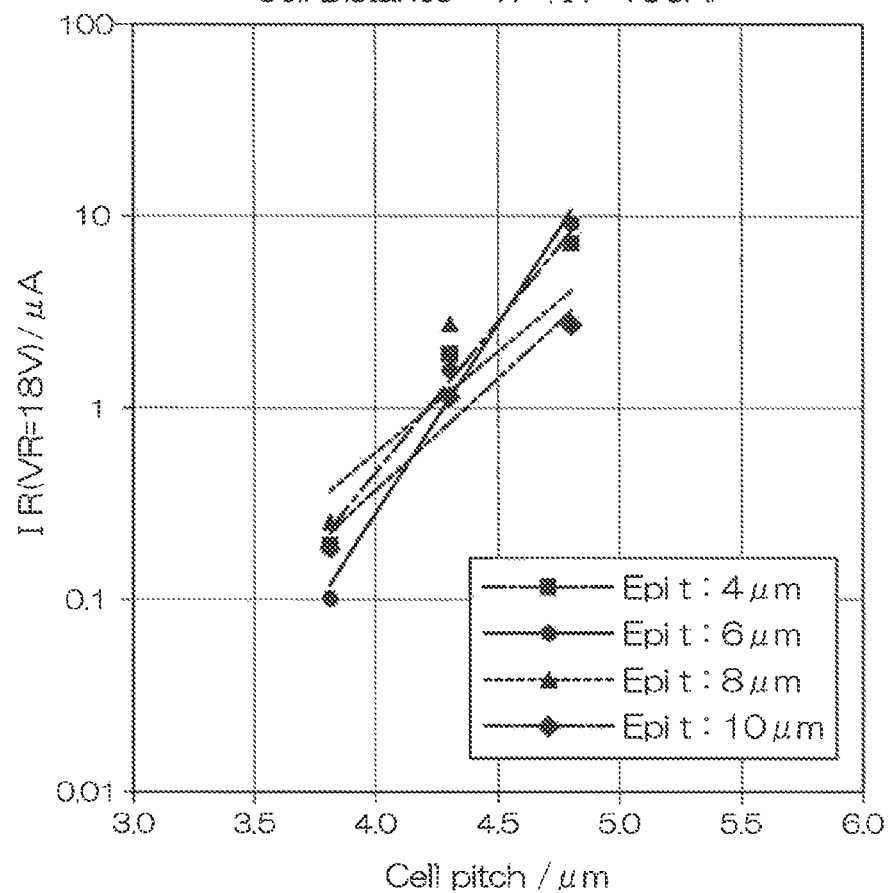
FIG. 9 is a graph showing a relationship of cell pitch with IR of the diode of FIG. 2 according to epi thickness.

Also, from FIG. 8, it can be understood that there is a tendency for the VF to increase as the cell pitch P1 narrows. On the other hand, in regard to the IR, it can be understood as shown in FIG. 9 that the IR decreases greatly as the cell pitch P1 narrows.

Figure 10:
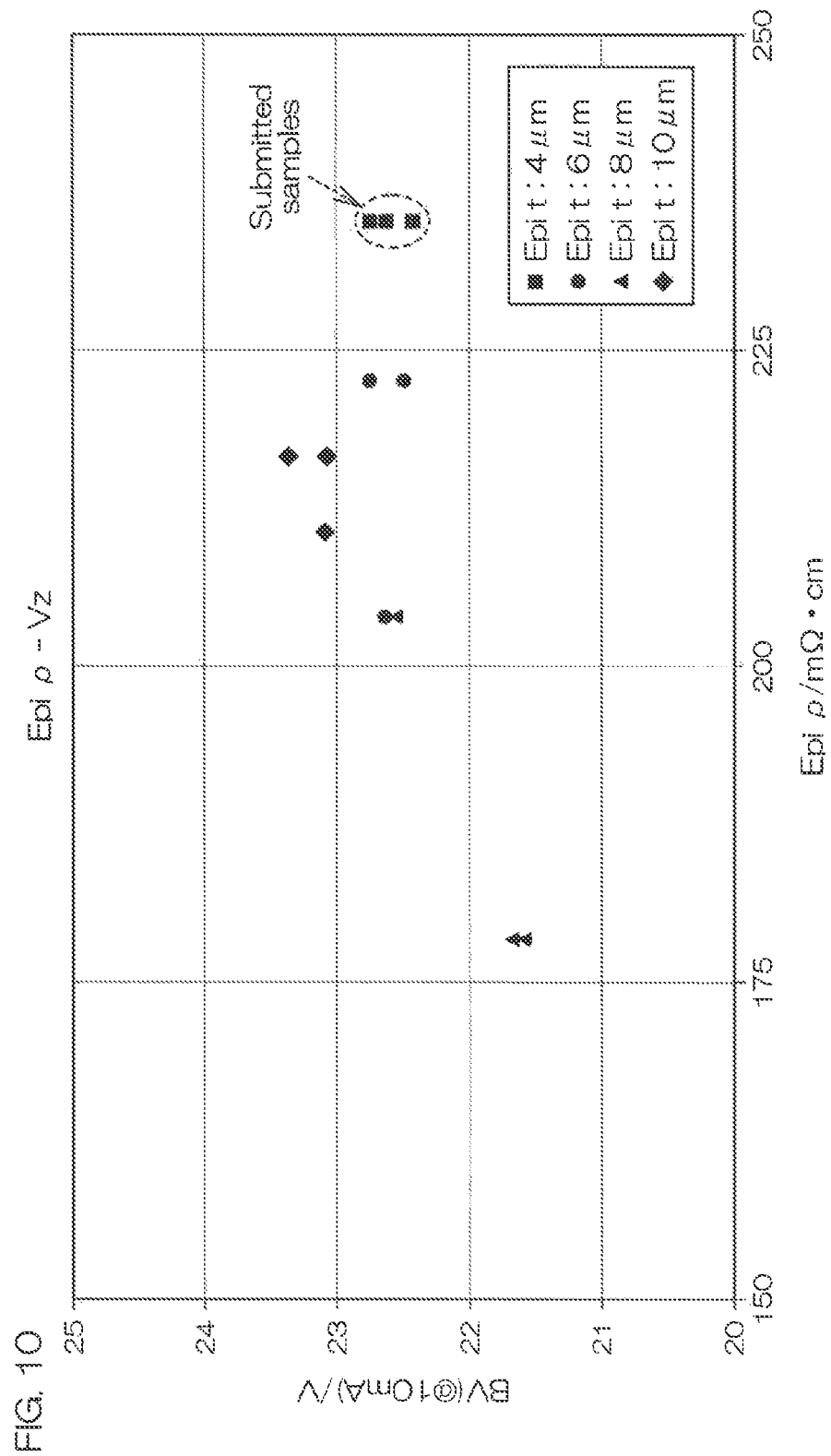
FIG. 10 is a graph showing a relationship of specific resistance with BV of the diode of FIG. 2 according to epi thickness.

As shown in FIG. 10, the BV does not have a regular relationship with respect to the epi thickness or the cell interval and can rather be said to depend on the specific resistance of the epitaxial layer 4. For example, the samples (submitted samples) of Nos. 10 to 12 are all the same in specific resistance and exhibited similar values of BV. Also, although the samples of Nos. 6 and 9 differ mutually in epi thickness, the samples are substantially the same in specific resistance and therefore exhibit similar BV values.

Figure 11:
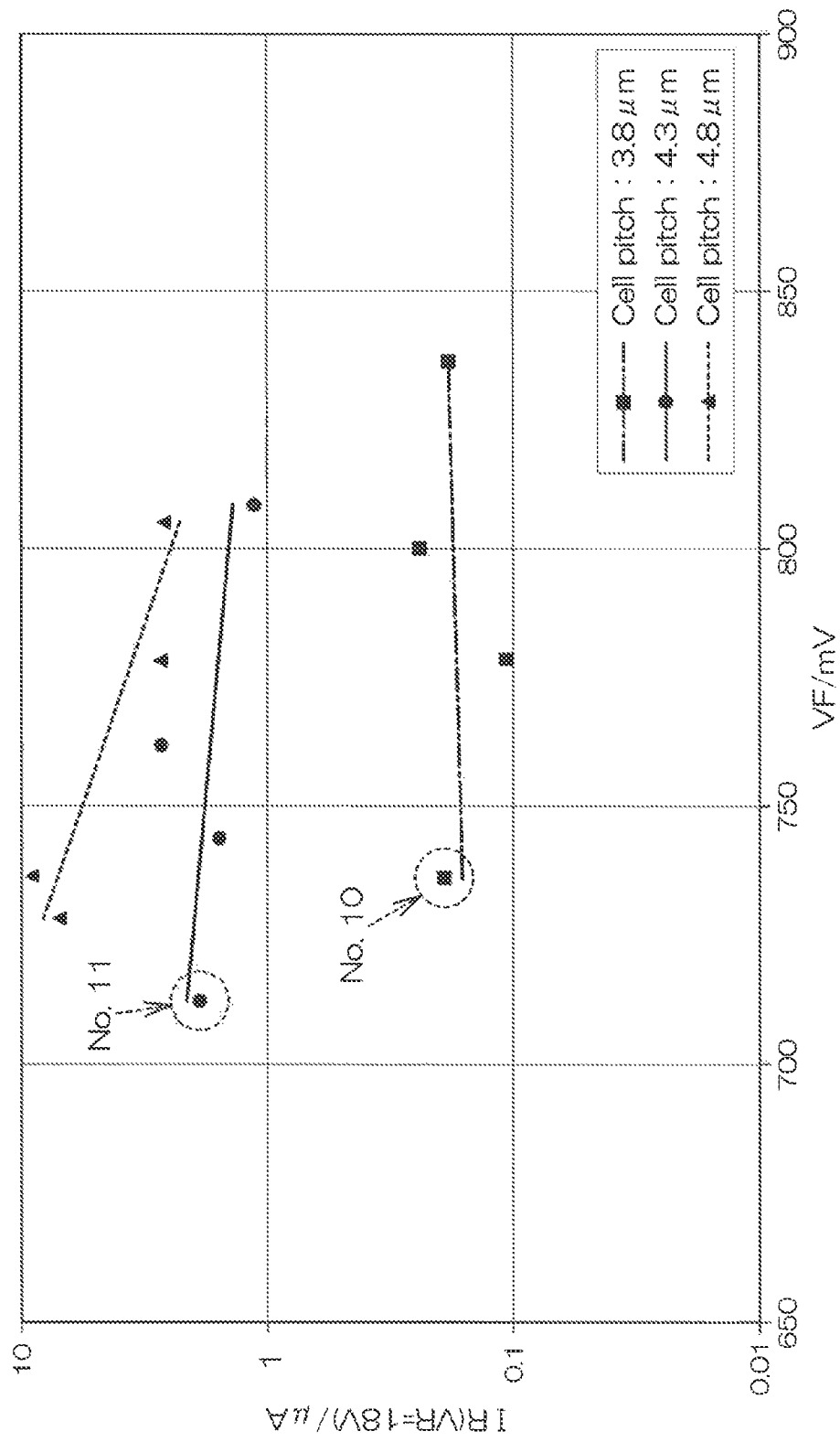
FIG. 11 is a graph showing a relationship of VF with IR of the diode of FIG. 2 according to cell pitch.
Figure 12:
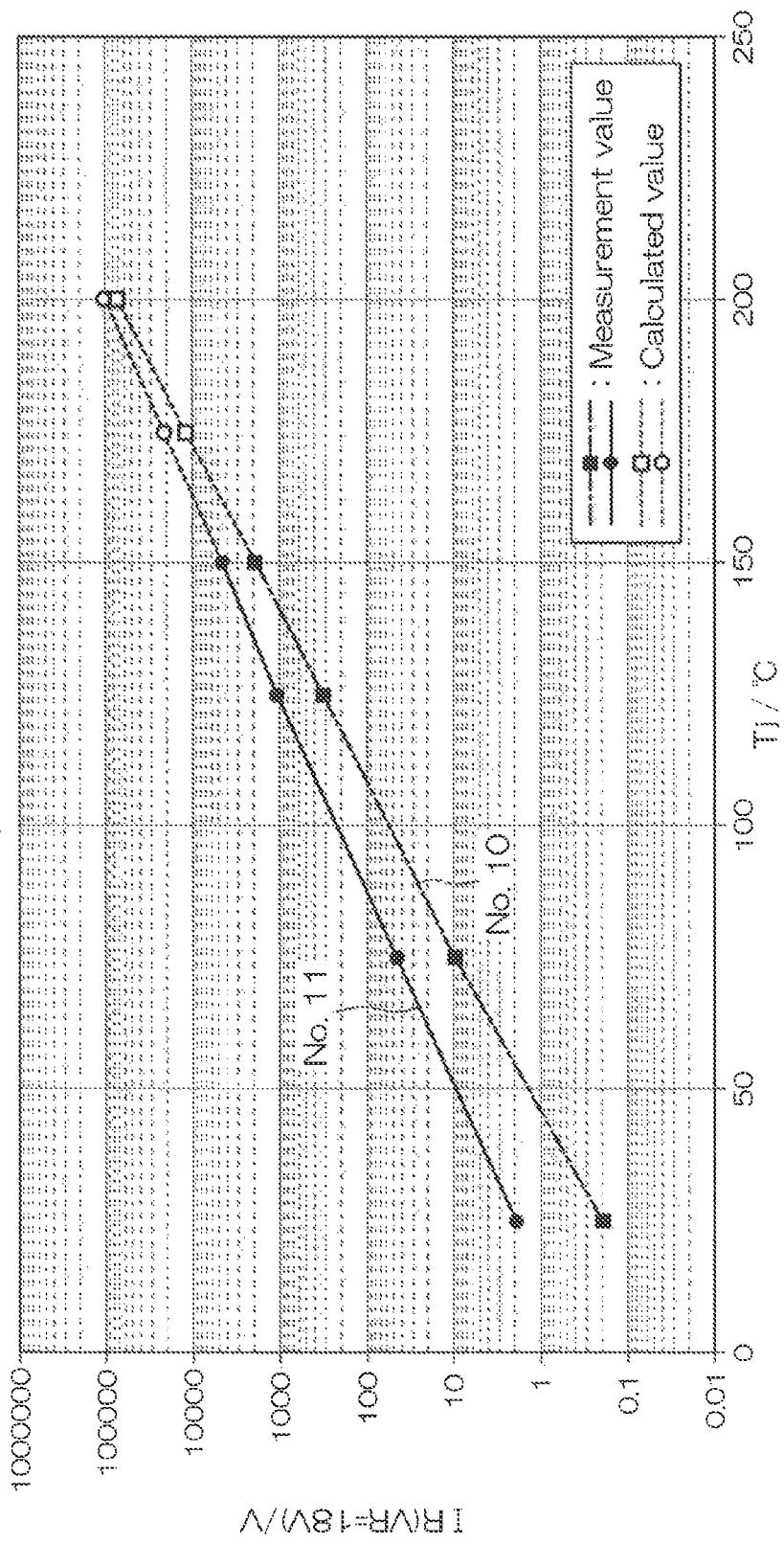
FIG. 12 is a graph showing a relationship of ambient temperature with IR of the diode of FIG. 2 according to epi thickness.

Temperature characteristics of VF and IR were also evaluated for the samples of No. 10 and No. 11, which, from the plots shown in FIG. 11, exhibit VF and IR that are comparatively satisfactory. The results are shown in FIG. 12.

From the above, it was found that by introducing the JBS structure 33, all target value items that could not be achieved with the structure without the JBS could be achieved. That is, it was possible to realize a low VF and a low IR by making the epitaxial layer 4 have the one stage structure of just the n⁻ type layer 6 and introducing the JBS structure 33. Further the present embodiment also includes the p⁺ type Zener diode region 14 and can thus realize a sufficient load dump tolerance as well.

Although a embodiment of the present invention has been described above, the present invention may also be implemented in other modes.

The target values set in the embodiment described above are merely one example of the characteristics of the diode desired by the inventors and the scope of the matters set forth in the claims is not restricted by the target values.

Besides the above, various design modifications may be made within the scope of the matters set forth in the claims.

Reference Invention

In relation to the "Summary of Invention" above, a embodiment of a reference invention provides a diode capable of realizing a low forward voltage (low VF) and a low reverse leakage current (low IR) in comparison to conventional arts.

A embodiment of the reference invention provides a diode that includes a semiconductor layer of a first conductivity type in turn including a first layer and a second layer with an impurity concentration lower than the first layer, a Zener diode region of a second conductivity type extending across the second layer from a front surface of the semiconductor layer to the first layer, and a Schottky metal disposed on the semiconductor layer and forming a Schottky junction with the second layer, and where the first layer has an impurity concentration of $1.0 \times 10^{16}$ cm$^{-3}$ to $2.4 \times 10^{17}$ cm$^{-3}$ and the second layer has an impurity concentration of $3.1 \times 10^{15}$ cm$^{-3}$ to $1.0 \times 10^{16}$ cm$^{-3}$.

In the embodiment of the reference invention, the Schottky metal has a work function of 3 eV to 6 eV.

In the embodiment of the reference invention, the Zener diode region provides a Zener effect together with the first layer.

In the embodiment of the reference invention, the Zener diode region has an impurity concentration $1 \times 10^{16}$ cm$^{-3}$ to $1 \times 10^{20}$ cm$^{-3}$.

In the embodiment of the reference invention, the Schottky metal includes Pt.

In the embodiment of the reference invention, the first layer has a thickness of 2 μm to 10 μm and the second layer has a thickness of 5 μm to 20 μm.

In the embodiment of the reference invention, the first layer has a specific resistance of 50 mΩ·cm to 500 mΩ·cm.

In the embodiment of the reference invention, the second layer has a specific resistance of 500 mΩ·cm to 1.5 Ω·cm.

The embodiment of the reference invention further includes a contact metal disposed on the Schottky metal.

A embodiment according to the reference invention shall now be described in detail with reference to the attached drawings.

First, the use and required specifications of the diode are as have been described with FIG. 1 above. That is, to make the alternator 1 high in efficiency and improve its reliability, low forward voltage (low VF), low reverse leakage current (low IR), etc., are required of the diodes Di used. As characteristics of a Zener-incorporated Schottky barrier diode according to the present application, the inventors of the present application set target values of VF: 0.70V typ. (IF=100 A), IR: 5 ρA max. (VR=18V), VZ: 21V to 25V (IZ=100 mA), and HIR (high-temperature reverse leakage current): 25 mA max. (VR=18V), and realized characteristics close to the target values by the arrangement of the embodiment according to the reference invention described below.

Figure 13:
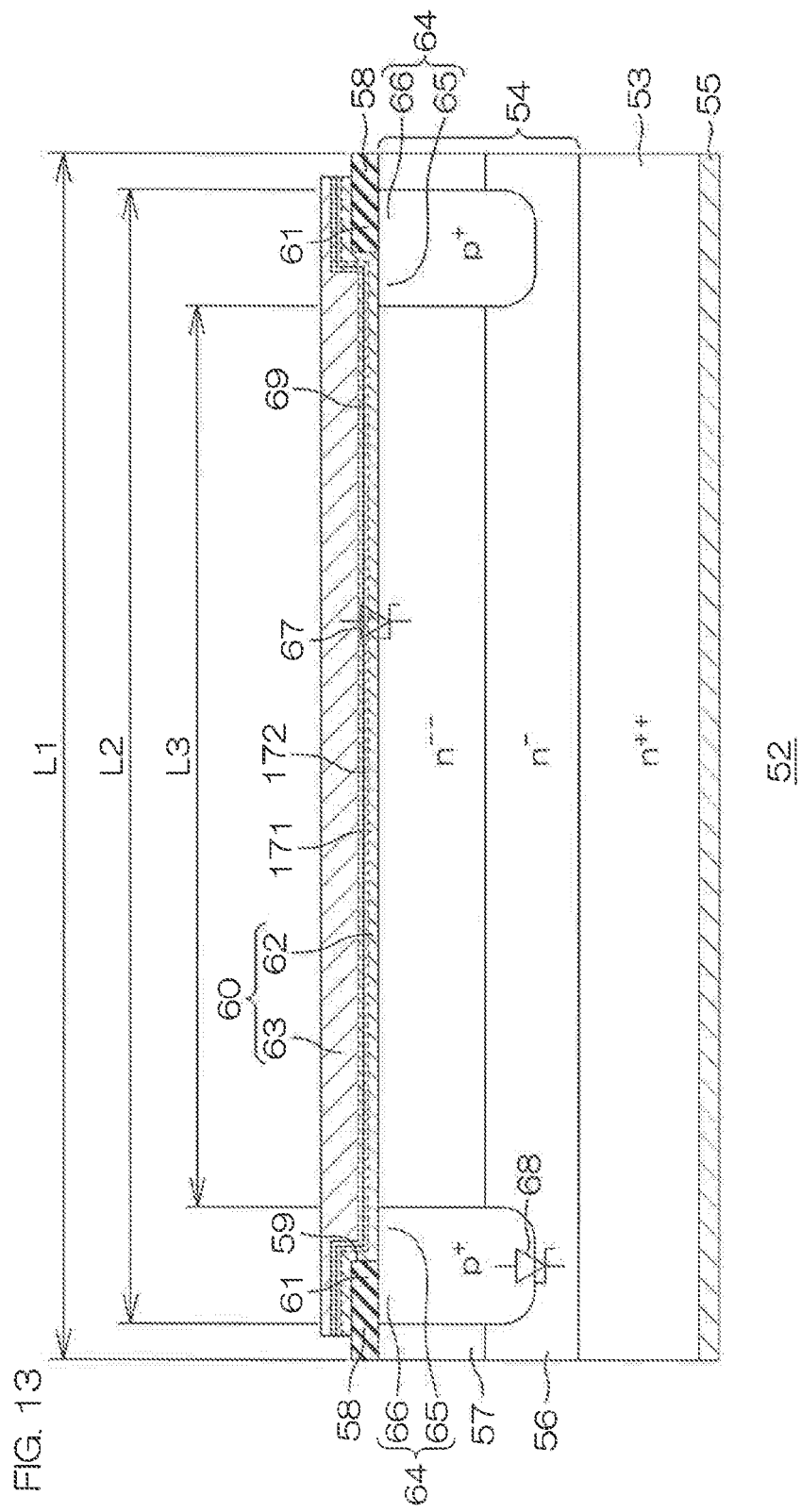
FIG. 13 is a schematic sectional view of a diode having a double epitaxial structure.

FIG. 13 is a schematic sectional view for describing the arrangement of a diode 52 having a double epitaxial structure.

The diode 52 has, for example, a shape of a chip that is square in plan view. The chip-shaped diode 52 has a size (L1 square=L1×L1) of, for example, 2 mm square to 10 mm square. Specifically, it may be approximately 5 mm square.

The diode 52 has an n⁺⁺ type silicon substrate 53 and an epitaxial layer 54, constituted of silicon, as an example of a semiconductor layer laminated on the n$^{++}$ type silicon substrate 53. On a rear surface of the n$^{++}$ type silicon substrate 53, a cathode electrode 55 is formed so as to cover its entirety. The cathode electrode 55 is constituted of a metal (for example, Al, Au, Ni, Ti, Pd, etc.) that is capable of being in ohmic contact with n$^{++}$ type silicon.

The n$^{++}$ type silicon substrate 53 has an impurity concentration of, for example, $1 \times 10^{19}$ cm$^{-3}$ to $1 \times 10^{21}$ cm$^{-3}$. Also, the n$^{++}$ type silicon substrate 53 has a thickness of, for example, 50 μm to 300 μm.

The epitaxial layer 54 includes an n$^{-}$ type layer 56 as an example of a first layer formed on a front surface of the n$^{++}$ type silicon substrate 53 and an n$^{--}$ type layer 57 formed on the n$^{-}$ type layer 56. The n$^{--}$ type layer 57 forms a front surface of the epitaxial layer 54.

An impurity concentration of the n$^{-}$ type layer 56 is, for example, $1.0 \times 10^{16}$ cm$^{-3}$ to $2.4 \times 10^{17}$ cm$^{-3}$. An impurity concentration of the n$^{--}$ type layer 57 is less than that of the n$^{-}$ type layer 56 and is, for example, $3.1 \times 10^{15}$ cm$^{-3}$ to $1.0 \times 10^{16}$ cm$^{-3}$. The n$^{-}$ type layer 56 and the n$^{--}$ type layer 57 thereby have specific resistances of, for example, 50 mΩ·cm to 500 mΩ·cm and 500 mΩ·cm to 1.5 Ω·cm, respectively. As specific values of the specific resistances, for example, that of the n$^{-}$ type layer 56 may be approximately 60 mΩ·cm and that of the n$^{--}$ type layer 57 may be approximately 1.0 Ω·cm.

Also, a thickness of the n$^{-}$ type layer 56 is, for example, 2 μm to 20 μm, and a thickness of the n$^{--}$ type layer 57 is, for example, 5 μm to 20 μm. Specifically, the thickness of the n$^{-}$ type layer 56 may be approximately 15.0 μm, and the thickness of the n$^{--}$ type layer 57 may be approximately 5.0 μm. The abovementioned thicknesses of the n$^{-}$ type layer 56 and the n$^{--}$ type layer 57 are design values. The design values are thicknesses after epitaxial growth of the n$^{-}$ type layer 56 and the n$^{--}$ type layer 57 but before the n type impurity inside the layers 56 and 57 is diffused by an annealing processing. Therefore, if, for example, in the process of diffusion of the impurity, the impurity diffuses beyond an interface immediately after epitaxial growth and diffuses from the n$^{-}$ type layer 56 to the n$^{--}$ type layer 57, the n$^{--}$ type layer 57 may become thinner than the design value and the n$^{-}$ type layer 56 may become thicker than the design value due to the diffusion.

A field insulating film 58 constituted of silicon oxide (SiO$_2$) is formed on the front surface of the epitaxial layer 54. The field insulating film 58 has a thickness of, for example, 1000 Å to 10000 Å. The field insulating film 58 may be constituted of another insulating material, such as silicon nitride (SiN), etc. An opening 59 exposing a central portion of the epitaxial layer 54 is formed in the field insulating film 58. An anode electrode 60 is formed on the field insulating film 58.

The anode electrode 60 fills the interior of the opening 59 in the field insulating film 58 completely and protrudes flange-like to an outer side of the opening 59 so as to cover from above, a peripheral edge portion 61 of the field insulating film 58 along the opening 59. That is, the peripheral edge portion 61 of the field insulating film 58 is sandwiched, along its entire periphery, from the respective upper and lower sides by the epitaxial layer 54 and the anode electrode 60.

The anode electrode 60 has a two-layer structure of a Schottky metal 62, joined to the epitaxial layer 54 (n$^{--}$ type layer 57) inside the opening 59 in the field insulating film 58, and a contact metal 63 laminated on the Schottky metal 62.

The Schottky metal 62 is a metal that forms a Schottky junction by being joined to the n$^{--}$ type layer 57 and it is further preferable to use a barrier metal material of greater Schottky barrier height (Φb: work function) than the conventionally used Mo or Ni. In the present embodiment, the Schottky metal 62 may be constituted of a metal having a work function of 3 eV to 6 eV. The work function of the Schottky metal 62 is more preferably 4 eV to 6 eV, even more preferably 5 eV to 6 eV, and especially preferably 5.3 eV to 6 eV. Experimentally, the above work functions are obtained, for example, by the Kelvin method (vibrating capacitance method) or by measuring the energy of thermionic emission or photoelectric emission. Specifically, as the specific metal used in the Schottky metal 62, although, for example, Ir (5.3 eV) or Pt (5.65 eV) is preferable, Mo (4.45 eV) may also be used.

Also, the Schottky metal 62 may be formed entirely as a Pt layer or a Pt silicide layer or, for example as defined by broken lines in FIG. 13, may be in a state where a Pt layer 172 remains on top of a Pt silicide layer 171. If the Schottky metal 62 is formed as a Pt silicide layer, a Pt layer is not present as a metal film and therefore, there are no problems in terms of close adhesion, etc., and an effect of preventing peeling of the Schottky metal 62 can be anticipated.

An intermediate metal layer 69, constituted of Mo, Ti, V, Cr, Zr, or Ta, may be included on the Schottky metal 62. If a Pt or Pt silicide layer is used in the Schottky metal 62, Mo is preferably used in the intermediate metal layer 69. In this case, a thickness of the intermediate metal layer 69 may be made comparatively thin, for example, approximately 350 Å.

The contact metal 63 is the portion of the anode electrode 60 that is exposed at the frontmost surface of the diode 52 and to which a bonding wire, etc., is bonded. The contact metal 63 is constituted, for example, of metals including Al, Ag, etc. Specifically, it may be constituted of Mo/Ti/Al/Ti/Ni/Ag (with Mo being at the Schottky metal 62 side), etc. The contact metal 63 may, for example, be greater in thickness than the Schottky metal 62. Also, although unillustrated, a passivation film may be formed on the frontmost surface of the diode 52 and an opening exposing the contact metal 63 may be formed in a central portion of the passivation film. A bonding wire, etc., is bonded to the contact metal 63 via the opening.

A p$^{+}$ type Zener diode region 64 is formed in the epitaxial layer 54 so as to be in contact with the Schottky metal 62. The p$^{+}$ type Zener diode region 64 is formed to an annular shape along a contour of the opening 59 in the field insulating film 58 and extends between the inside and the outside of the opening 59. The p$^{+}$ type Zener diode region 64 thus includes an inner portion 65, protruding to the inside of the opening 59 and contacting a terminal portion of the Schottky metal 62 inside the opening 59, and an outer portion 66, protruding to the outside of the opening 59 and facing the Schottky metal 62 across the peripheral edge portion 61 of the field insulating film 58. An outer edge of the outer portion 66 is set to be further inward than an outer edge of the Schottky metal 62.

Also, the p$^{+}$ type Zener diode region 64 extends across (penetrates through) the n$^{--}$ type layer 57 from the front surface of the epitaxial layer 54 to an intermediate portion in a thickness direction of the n$^{-}$ type layer 56. The p$^{+}$ type Zener diode region 64 thus contacts the n$^{-}$ type layer 56 and the n$^{--}$ type layer 57 at its side portions and contacts the n type layer 56 at its bottom portion. Such a structure may be formed, for example, by epitaxially growing the n$^{-}$ type layer 56 and the n$^{--}$ type layer 57 successively on the n$^{++}$ type silicon substrate 53 and thereafter implanting and diffusing a p type impurity at a comparatively high energy in the epitaxial layer 54. A depth of the p$^+$ type Zener diode region 64 may specifically be, for example, 2 μm to 10 μm. Also, an impurity concentration of the p$^+$ type Zener diode region 64 is, for example, 1×10$^{16}$ cm$^{-3}$ to 1×10$^{20}$ cm$^{-3}$.

With the diode 52, a Schottky barrier is formed between the Schottky metal 62 and the n$^{--}$ type layer 57 to arrange a Schottky barrier diode 67 (Schottky Diode). On the other hand, a pn junction is formed between the p$^+$ type Zener diode region 64 and the n$^-$ type layer 56 and the n$^{--}$ type layer 57 to arrange a Zener diode 68 (Zener Di).

Figure 14:
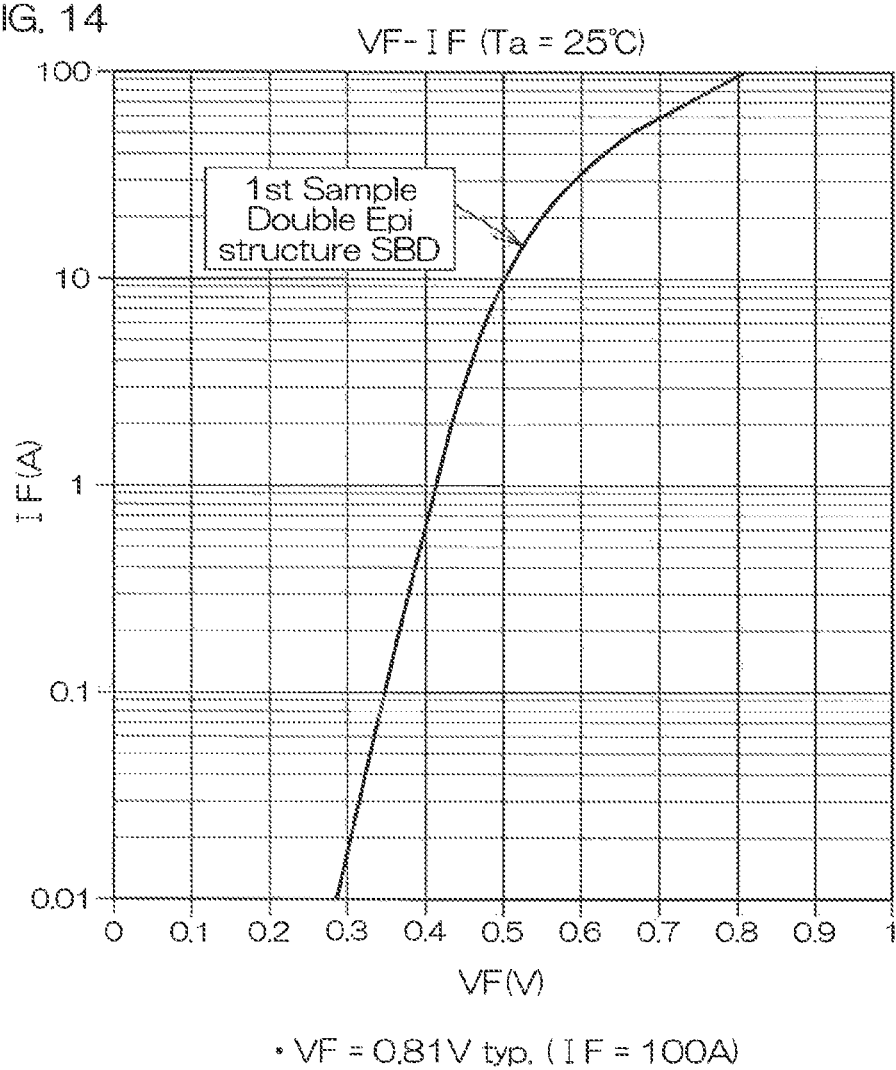
FIG. 14 is a graph showing the VF-IF characteristics of an experimental example (Sample 1) of the diode.
Figure 15:
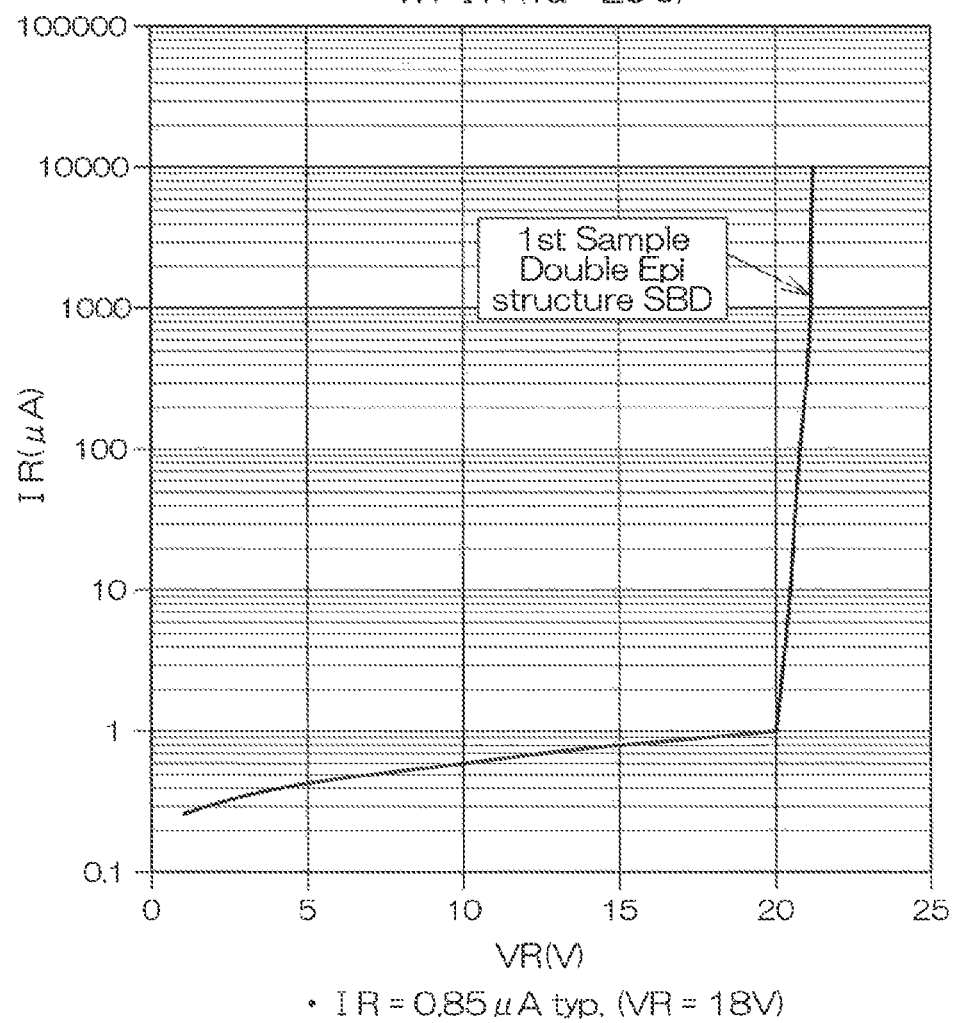
FIG. 15 is a graph showing VR-IR characteristics of Sample 1.
Figure 16:
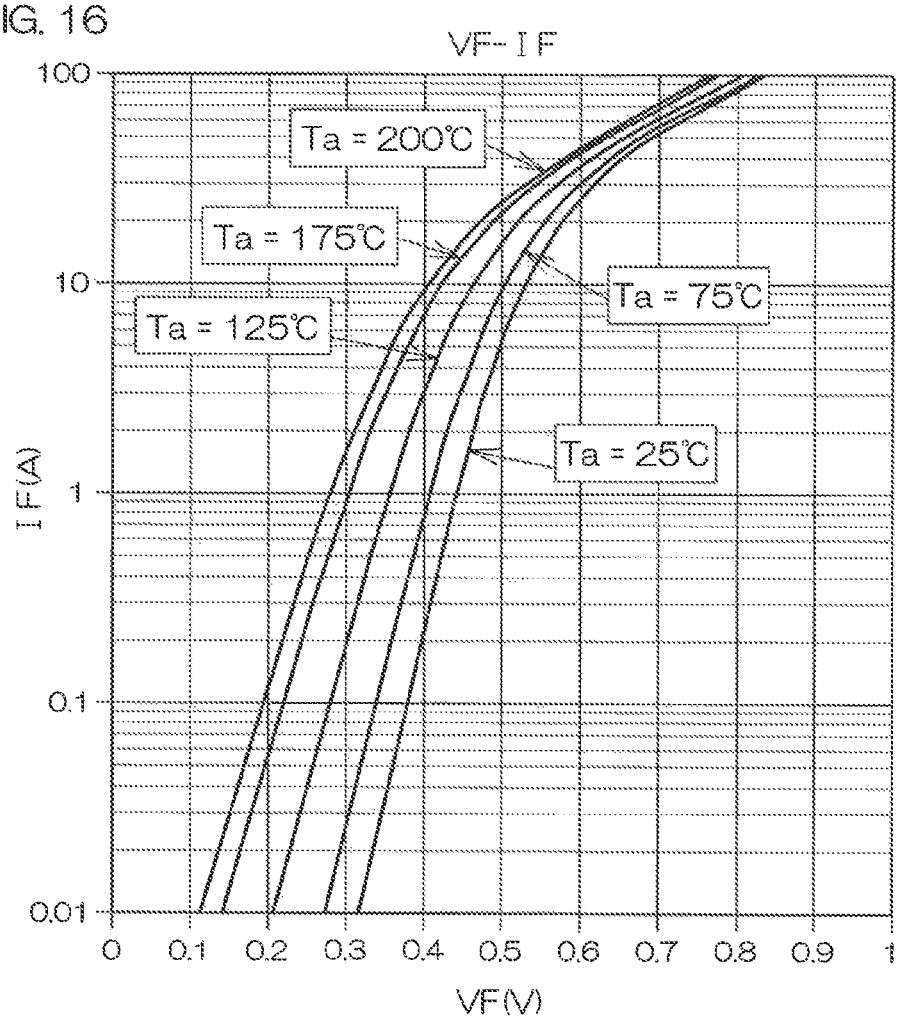
FIG. 16 is a graph showing temperature characteristics of VF-IF of Sample 1.
Figures 17, 18:
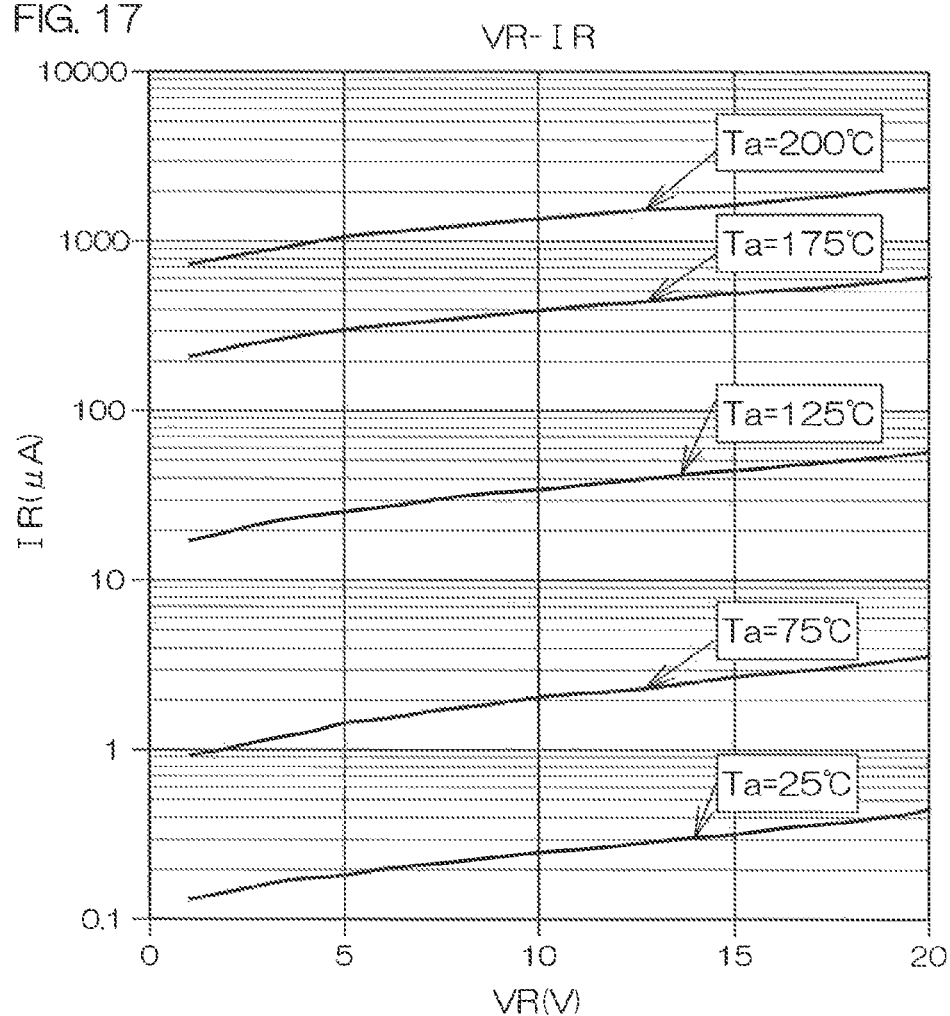
FIG. 17 is a graph showing temperature characteristics of VR-IR of Sample 1.
FIG. 18 is a table showing evaluation results of Sample 1.

Respective characteristics of a specific experimental example (Example 1) of the diode 52 shall now be described. That is, Sample 1 (1st Sample) was prepared in accordance with the arrangement of the diode 52 and the characteristics of Sample 1 were evaluated. The following are the main conditions of Sample 1 (all are design values).

n$^-$ type layer 56: concentration 1.7×10$^7$ cm$^{-3}$, specific resistance 60 mΩ·cm, thickness 15.0 μm n$^{--}$ type layer 57: concentration 4.8×10$^5$ cm$^{-3}$, specific resistance 1.0 Ω·cm, thickness 5.0 μm Schottky metal 62: uses Pt Chip size: 5 mm square Outer diameter L2 of the p$^+$ type Zener diode region 64: 4800 μm Inner diameter L3 of the p$^+$ type Zener diode region 64: 3800 μm FIG. 14 and FIG. 15 are graphs showing VF-IF characteristics and VR-IR characteristics, respectively, of Sample 1. Also, FIG. 16 and FIG. 17 are graphs showing temperature characteristics of the VF-IF of FIG. 14 and the VR-IR of FIG. 15, respectively. FIG. 18 is a table showing the evaluation results of Sample 1. In FIG. 14 to FIG. 17, Ta expresses an ambient temperature of Sample 1.

As shown in FIG. 14 to FIG. 18, with Sample 1, the target values were achieved for all characteristics except the VF. On the other hand, it was confirmed that although the VF was 0.81V typ. (IF=100 A) and slightly higher than the target value of 0.70V typ. (IF=100 A), it is of a level that sufficiently enables use for practical purposes.

Figure 19:
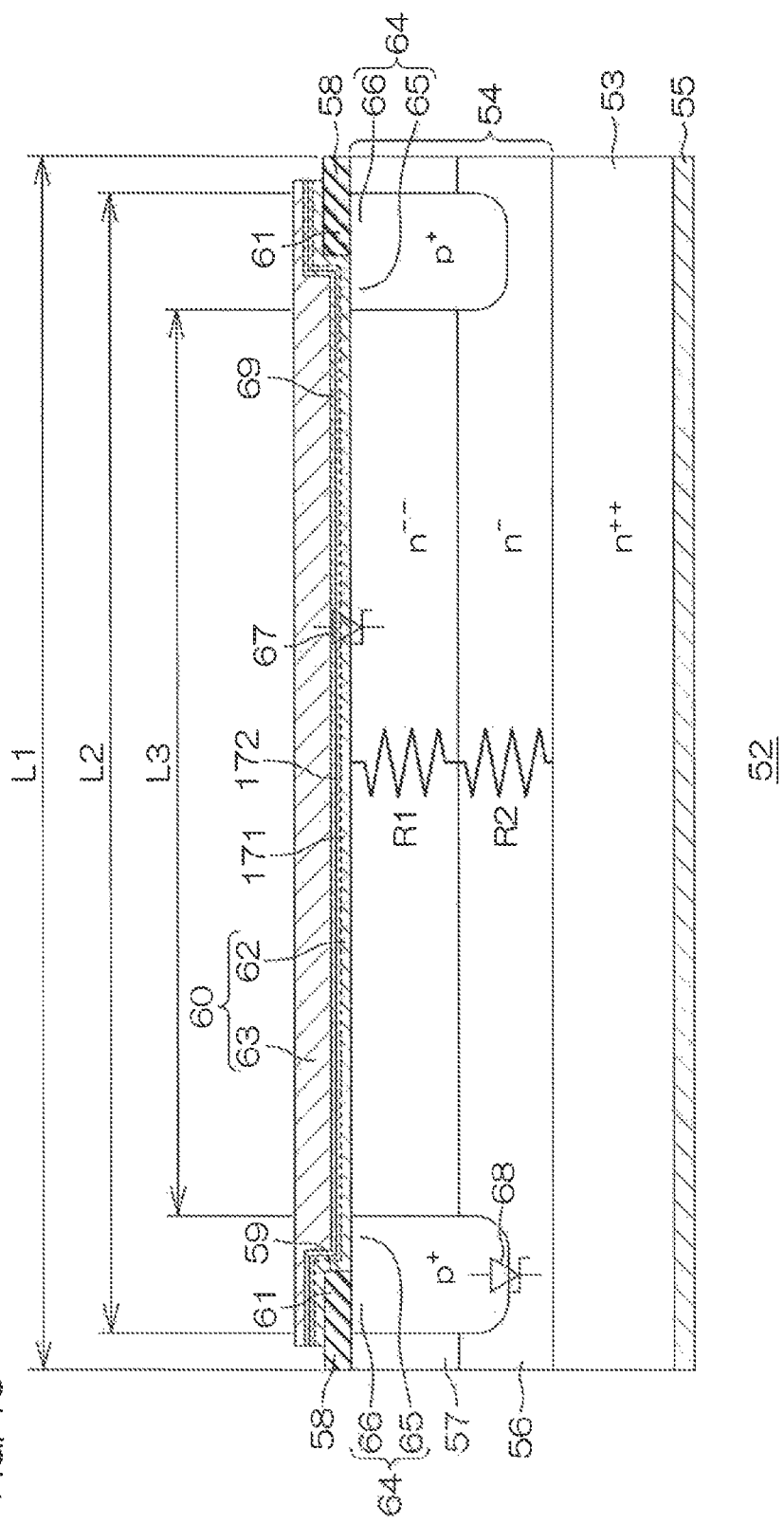
FIG. 19 is a diagram for describing serial resistances inside an epitaxial layer of Sample 1.

FIG. 19 is a diagram for describing serial resistances inside the epitaxial layer 54 of the diode 52.

As shown in FIG. 19, the n$^-$ type layer 56 and the n$^{--}$ type layer 57 respectively have resistance values (specific resistances) that are not 0 and therefore, between the anode electrode 60 and the cathode electrode 55, these are current carrying media and are at the same time mutually serially connected resistances. When expressed in electrical drawing symbols, the n$^-$ type layer 56 and the n$^{--}$ type layer 57 have resistances R2 and R1, respectively. The resistances R1 and R2 constitute a factor that makes the VF of the diode 52 high. Measures for reducing the serial resistances R1 and R2 and effects of adopting the reducing measures shall now be described in detail.

Figure 20:
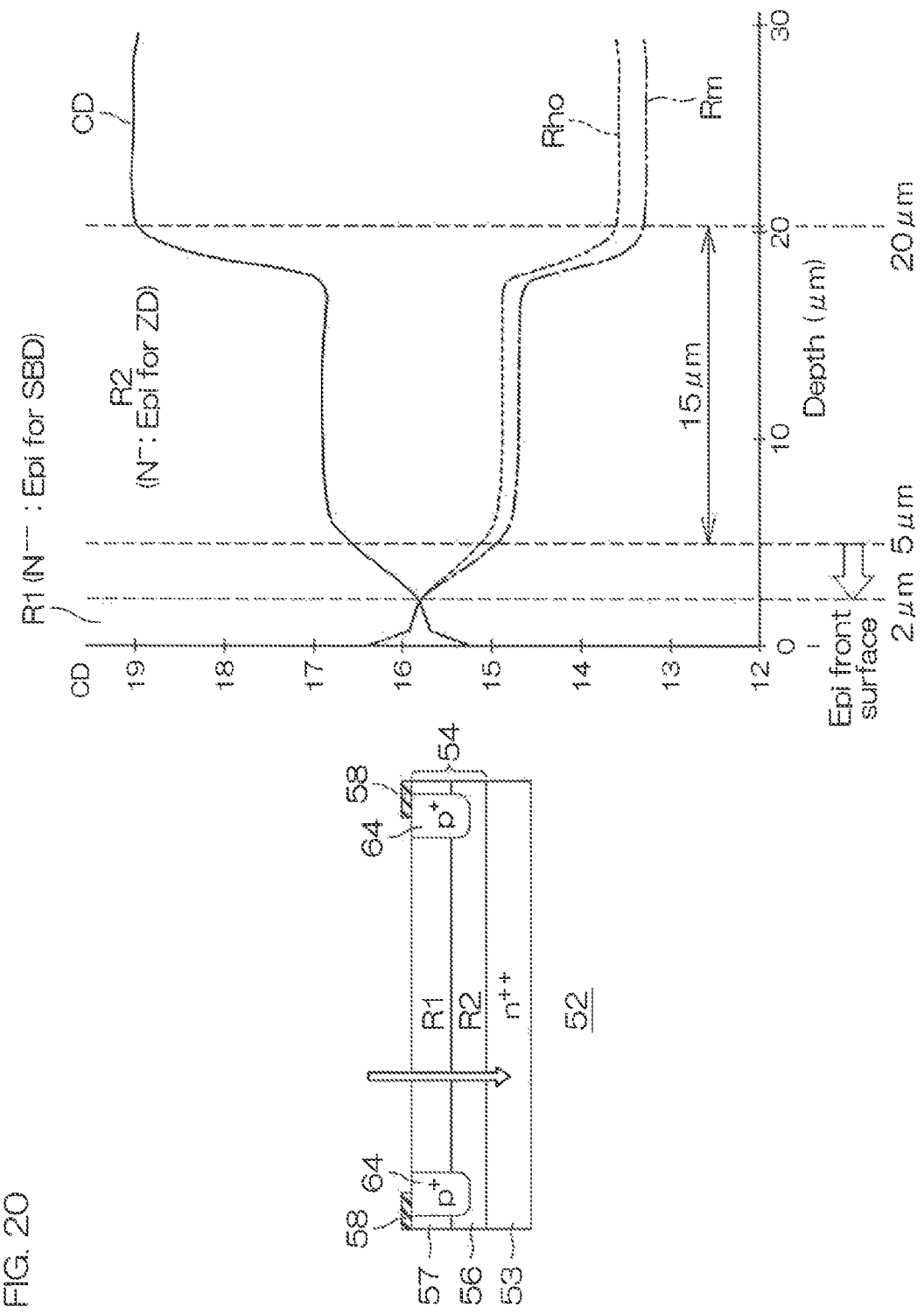
FIG. 20 is a concentration profile of an n type layer of Sample 1.
Figure 21:
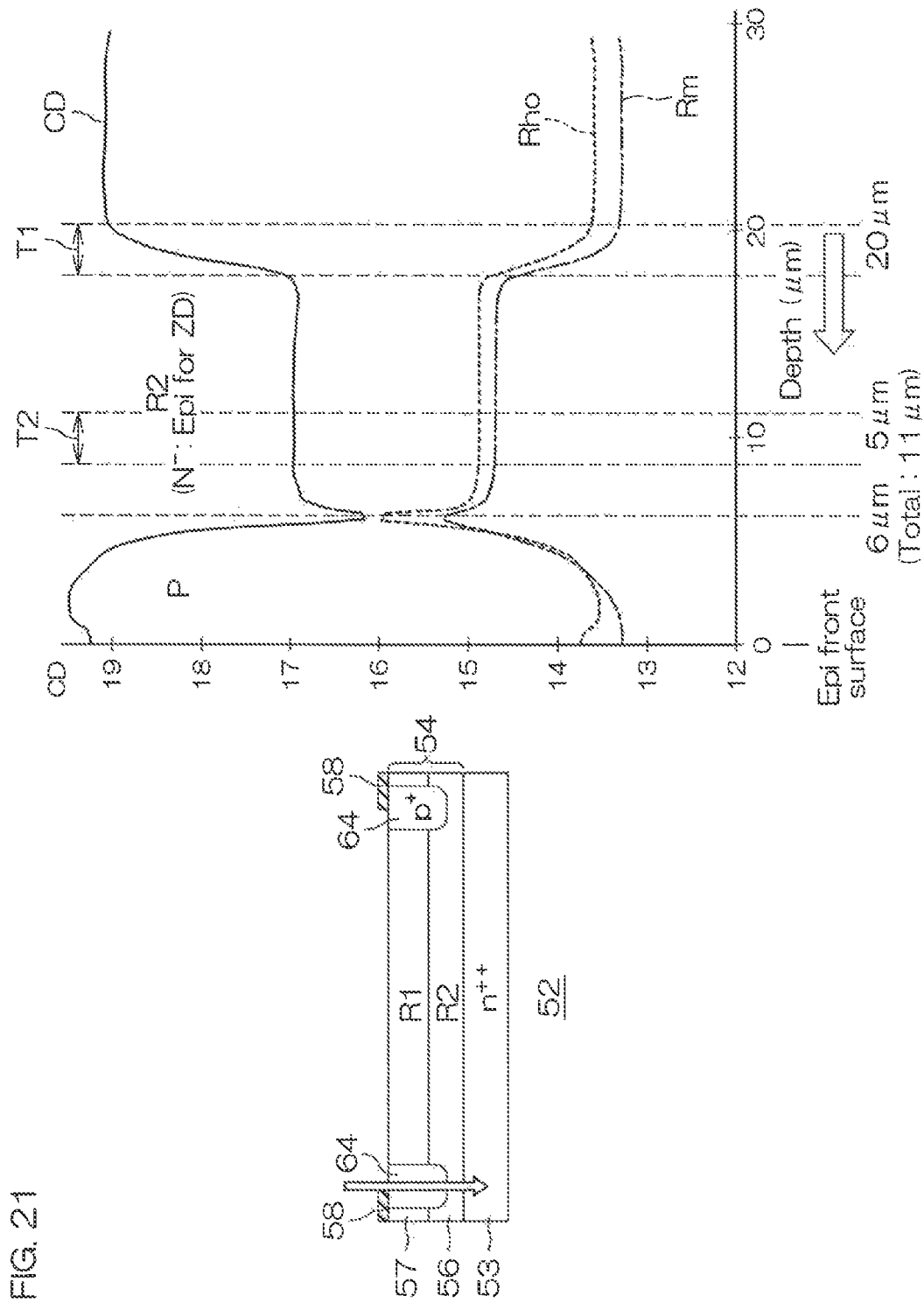
FIG. 21 is a concentration profile of a p type layer of Sample 1.

FIG. 20 and FIG. 21 are concentration profiles of an n type layer and a p type layer, respectively, of Sample 1. In the graph of each figure, a y-axis at a left end of the paper surface indicates the front surface position of the epitaxial layer 54 and the further to the right a position is from the y-axis, the deeper it is from the front surface of the epitaxial layer 54. Also in the graph of each figure, a solid line indicates a concentration (CD) of an n type or a p type impurity.

As a measure for reducing the absolute value of the resistance of a semiconductor layer, there is a measure of thinning the semiconductor layer that has resistance. It is considered that the serial resistances R2 and R1 can be reduced respectively by thinning the n$^-$ type layer 56 and the n$^{--}$ type layer 57 in Sample 1 as well.

Although the most preferable mode is to thin both the n$^-$ type layer 56 and the n$^{--}$ type layer 57, when, with reference to FIG. 20, an interface position of the n$^-$ type layer 56 and the n$^{--}$ type layer 57 is judged from just the n type impurity concentration as an index, it is at a position of 2 μm from the front surface of the epitaxial layer 54. This is because, even though the n$^{--}$ type layer 57 was formed to a thickness of 5 μm as the design value, the diffusion of impurity from the n$^-$ type layer 56 to the n$^{--}$ type layer 57 caused the concentration of the n$^{--}$ type layer 57 to increase near the interface with the n$^-$ type layer 56 and a portion of the n$^{--}$ type layer 57 (the portion corresponding to a thickness of 3 μm in FIG. 20) became an n$^-$ type and the actual interface moved further toward the front surface side than the design interface. Therefore, if the n$^{--}$ type layer 57 is designed to be thinner than 5 μm, the entire region of the n$^{--}$ type layer 57 may become an n$^-$ type in the diffusion process and the Schottky interface may become an n$^-$ type silicon. With such a Schottky interface, the height of the Schottky barrier will be low and even if the serial resistance R1 can be reduced, the IR at the Schottky barrier diode 67 may oppositely increase. That is, with an arrangement such as the diode 52 in which a p type region is not formed selectively at the Schottky interface, at least the n type layer at the Schottky interface must be made comparatively low in concentration. Therefore, with Sample 1, it is difficult to make the n$^{--}$ type layer 57 any thinner (less than 5 μm).

On the other hand, with reference to FIG. 21, the depth of the p$^+$ type Zener diode region 64, as an actual measurement value, is 6 μm. Therefore, even if a margin T2, corresponding to a thickness T1 of a region near the interface of the n$^-$ type layer 56 and the n$^{++}$ type silicon substrate 53 at which the profile increases, is taken into consideration, as long as the n$^-$ type layer 56 has a thickness of 5 μm as the design value, the p$^+$ type Zener diode region 64 will not penetrate through the n$^-$ type layer 56 and reach the n$^{++}$ type silicon substrate 53 and the bottom portion of the p$^+$ type Zener diode region 64 can be disposed reliably within the n$^-$ type layer 56.

That is, it can be understood from FIG. 20 and FIG. 21 that by decreasing the thickness (design value) of the n type layer 56 from 15 μm to 5 μm while maintaining the thickness of the n$^{--}$ type layer 57, the serial resistance R2 of the diode 52 can be reduced without influencing whatsoever the junction relationships of the Schottky metal 62 and the p$^+$ type Zener diode region 64 with the n type layers.

The inventors of the present application thus evaluated by simulation what influence the thinning of the n type layer 56 may have on the characteristics of the diode 52. As simulation conditions, the thickness of the n$^-$ type layer 56 was set to 5 μm, 10 μm, and 15 μm.

Figure 22:
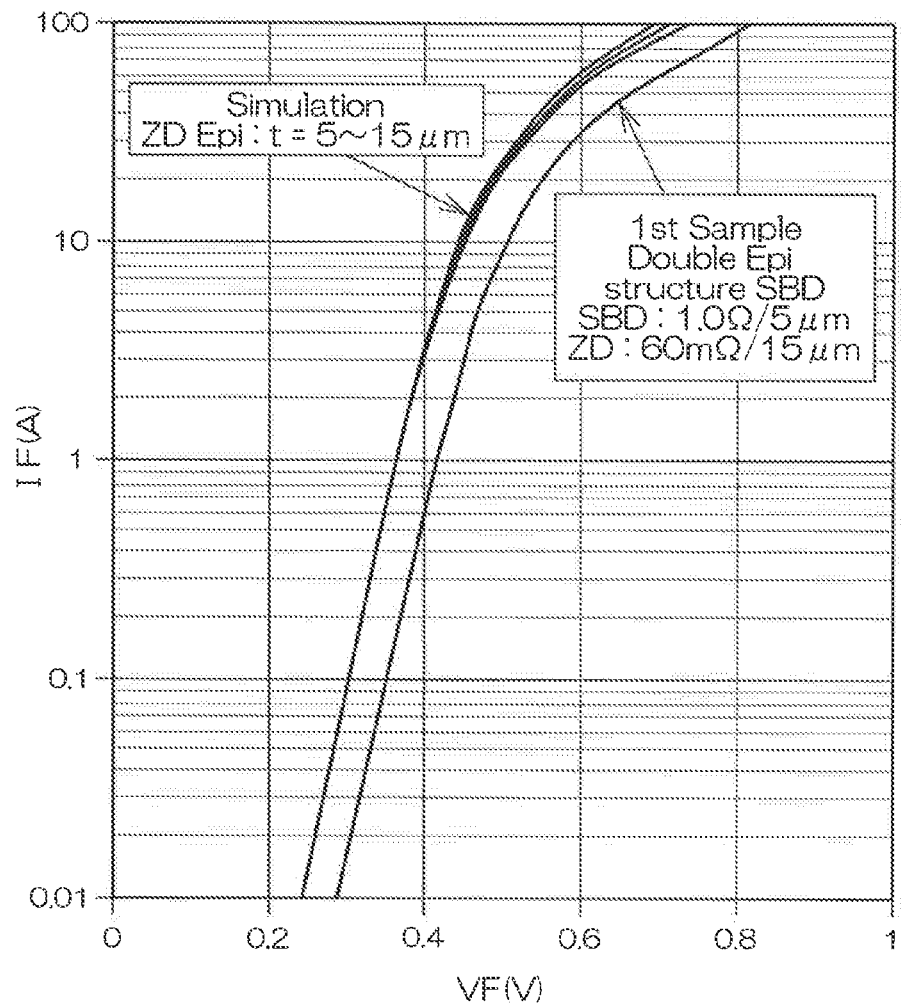
FIG. 22 is a graph showing VF-IF characteristics (simulation) of Sample 1.

FIG. 22 is a graph showing the VF-IF characteristics (simulation) of Sample 1. As shown in FIG. 22, it can be understood that the smaller the thickness (epi thickness) of the n$^-$ type layer 56, the lower the VF of Sample 1 at IF=100 A.

Figure 23:
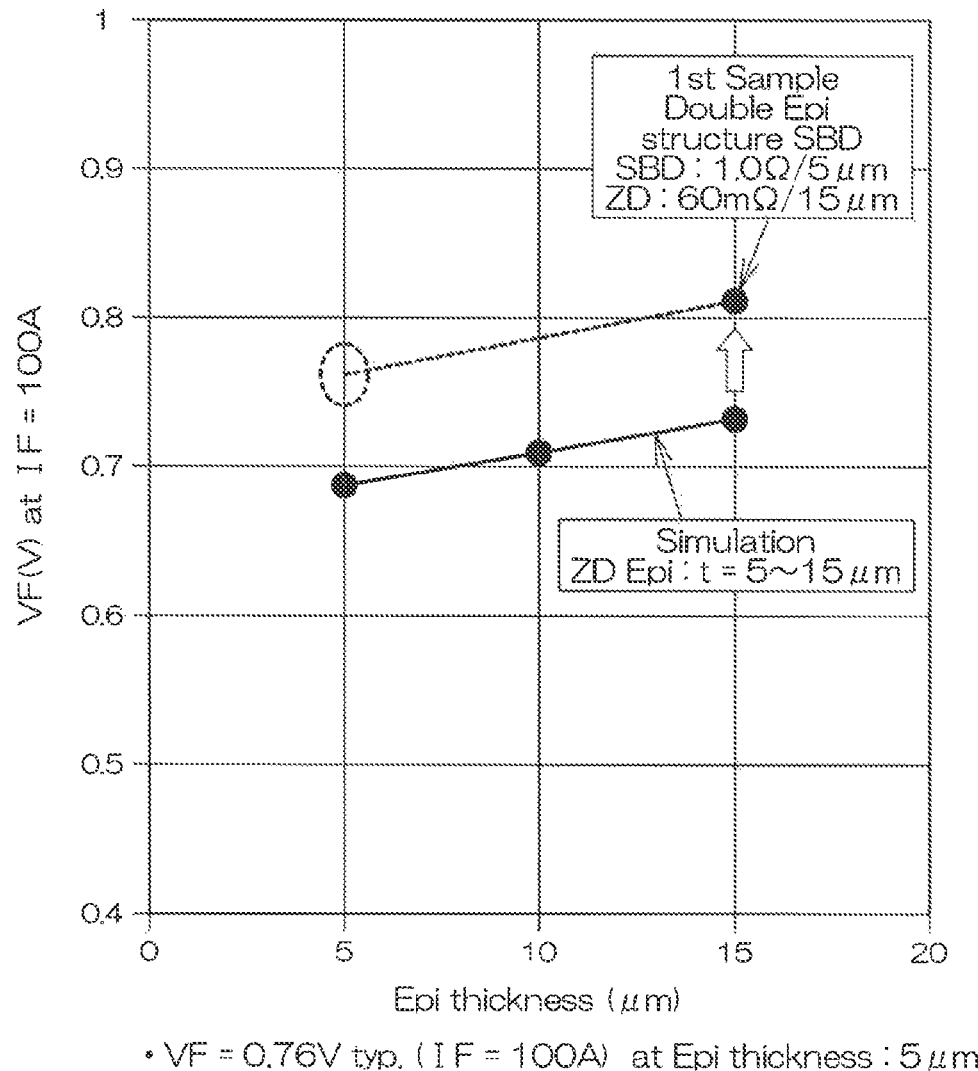
FIG. 23 is a graph showing a relationship of VF with epi thickness prepared based on the simulation.

The graph of FIG. 23 more clearly indicates the relationship of the VF with the epi thickness prepared based on the simulation. That is, with the simulation, the relationship of the thickness of the n$^-$ type layer 56 with the VF is as follows.

Thickness of the *n*$^-$ type layer 56=5 μm→VF=0.69V typ.

Thickness of the n⁻ type layer 56=10 μm→VF=0.71V typ.

Thickness of the n⁻ type layer 56=15 μm→VF=0.74V typ.

Here, the thickness of 15 μm is the thickness of the n⁻ type layer 56 of the actual Sample 1 (not a simulation) and therefore the difference between the actual measurement value (0.81V typ.) and the simulation value (0.74V typ.) of the VF for the thickness of 15 μm is determined as 0.07V typ. When the simulation results for 5 μm and 10 μm are corrected based on this difference, prediction values are calculated as 0.76V typ. and 0.78V typ., respectively. That is, the graph indicated by the broken line in FIG. 23 expresses the relationship (including prediction values) of the VF and the epi thickness in Sample 1. From the above, it is clear that VF=0.76V typ. (IF=100 A) can be achieved when the thickness of the n⁻ type layer 56 is set to 5 μm.

Figures 24, 25:
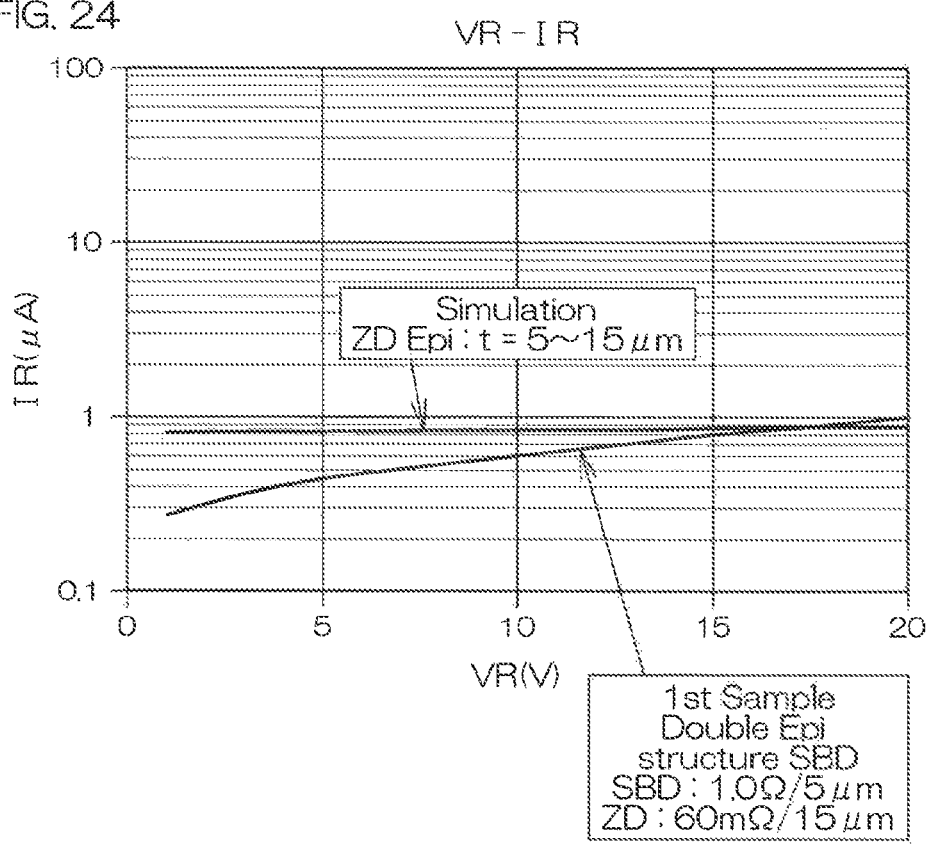
FIG. 24 is a graph showing VR-IR characteristics (simulation) of Sample 1.
FIG. 25 is a table showing evaluation results of the simulation.

On the other hand, FIG. 24 is a graph showing the VR-IR characteristics (simulation) of Sample 1. From FIG. 24, it can be understood that the IR of Sample 1 does not change even if the n⁻ type layer 56 is thinned.

FIG. 25 is a table showing the evaluation results of the simulation and compares the characteristics of Sample 1 before and after the thinning of the n⁻ type layer 56. As shown in FIG. 25, by thinning the n⁻ type layer 56 from 15 μm to 5 μm, the VF (IF=100 A) can be reduced from 0.81V typ. to 0.76V typ. and is made closer to the target value than before thinning.

Although a embodiment of the reference invention has been described above, the reference invention may also be implemented in other modes.

What is claimed is:

1. A diode comprising: a semiconductor layer of a first conductivity type having an impurity concentration of $1 \times 10^{16}$ cm$^{-3}$ to $2.4 \times 10^{17}$ cm$^{-3}$;
   a Zener diode region of a second conductivity type formed selectively in the semiconductor layer and forming a pn junction with the semiconductor layer;
   a Schottky metal disposed on the semiconductor layer such that the Schottky metal is connected to the Zener diode region, the Schottky metal forming a Schottky junction with the semiconductor layer, the Schottky metal made of Ir or Pt, and the Schottky metal having a work function of 5.3 eV to 6 eV; and
   a JBS (junction barrier Schottky) structure including a plurality of second conductivity type regions each having an upper surface which is entirely covered with a region of the Schottky junction of the semiconductor layer in a thickness direction the semiconductor layer.

2. The diode according to claim 1, wherein the semiconductor layer has an impurity concentration of $1 \times 10^{16}$ cm$^{-3}$ to $2.4 \times 10^{17=-3}$.

3. The diode according to claim 1, wherein the semiconductor layer has an impurity concentration of $10.8 \times 10^{16}$ cm$^{-3}$ to $2.4 \times 10^{17}$ cm$^{-3}$.

4. The diode according to claim 1, wherein the semiconductor layer has an impurity concentration of $10.8 \times 10^{16}$ cm$^{-3}$ to $8.0 \times 10^{16}$ cm$^{-3}$.

5. The diode according to claim 1, wherein the semiconductor layer has a specific resistance of 50 mΩ·cm to 500 mΩ·cm.

6. The diode according to claim 1, wherein the semiconductor layer has a specific resistance of 50 mΩ·cm to 300 mΩ·cm.

7. The diode according to claim 1, wherein the semiconductor layer has a specific resistance of 100 mΩ·cm to 300 mΩ·cm.

8. The diode according to claim 1, wherein the semiconductor layer has a thickness of 2 μm to 10 μm.

9. The diode according to claim 1, wherein the semiconductor layer has a thickness of 2 μm to 6 μm.

10. The diode according to claim 1, wherein the semiconductor layer has a thickness of 2.5 μm to 5 μm.

11. The diode according to claim 1, wherein each of the second conductivity type regions has a width W1 of 0.1 μm to 10 μm.

12. The diode according to claim 1, wherein each of the second conductivity type regions has a width W1 of 1 μm to 5 μm.

13. The diode according to claim 1, wherein each of the second conductivity type regions has a width W1 of 1 μm to 2 μm.

14. The diode according to claim 1, wherein the plurality of second conductivity type regions are arrayed at a pitch P1 of 2 μm to 5 μm.

15. The diode according to claim 1, wherein the plurality of second conductivity type regions are arrayed at a pitch P1 of 2.5 μm to 4.5 μm.

16. The diode according to claim 1, wherein the plurality of second conductivity type regions are arrayed at a pitch P1 of 3 μm to 4 μm.

17. The diode according to claim 1, wherein the plurality of second conductivity type regions are arrayed so that there is a distance D1 of 0.1 μm to 6 μm between the mutually adjacent second conductivity type regions.

18. The diode according to claim 1, wherein the plurality of second conductivity type regions have a regularity of a regular hexagonal array.

19. The diode according to claim 1, wherein the plurality of second conductivity type regions have the same depth as the Zener diode region.

20. The diode according to claim 1, wherein the Zener diode region has an impurity concentration of $1 \times 10^{16}$ cm$^{-3}$ to $1 \times 102°$ cm$^{-3}$.

21. The diode according to claim 1, wherein the Schottky metal includes Pt.

22. The diode according to claim 21, wherein the Schottky metal includes a Pt silicide layer or a Pt silicide layer and a Pt layer on the Pt silicide layer.

23. The diode according to claim 1, further comprising a contact metal disposed on the Schottky metal.

24. The diode according to claim 1, further comprising an intermediate metal layer disposed between the Schottky metal and the contact metal and including Mo, Ti, V, Cr, Zr, or Ta.

25. The diode according to claim 1, wherein
   the plurality of second conductivity type regions have a regularity of a regular hexagonal array,
   the semiconductor layer has a thickness of 2.5 μm to 5 μm,
   each of the second conductivity type regions has a width W1 of 1 μm to 2 μm, and
   the diode limits a forward voltage to not more than 0.65 V and limits a reverse leakage current to not more than 5 μA.

26. The diode according to claim 1, wherein
   the Zener diode region is formed in an annular shape,
   the plurality of second conductivity type regions are disposed in a region surrounded by the annular shape of the Zener diode region, and a portion of the Zener diode region is covered with the Schottky metal and a remaining portion of the Zener diode region is covered with an insulating layer.

27. A diode comprising: a semiconductor layer of a first conductivity type having a specific resistance of 50 mΩ·cm to 500 mΩ·cm;
- a Zener diode region of a second conductivity type formed selectively in the semiconductor layer and forming a pn junction with the semiconductor layer;
- a Schottky metal disposed on the semiconductor layer such that the Schottky metal is connected to the Zener diode region, the Schottky metal forming a Schottky junction with the semiconductor layer, the Schottky metal made of Ir or Pt, and the Schottky metal having a work function of 5.3 eV to 6 eV; and
- a JBS (junction barrier Schottky) structure including a plurality of second conductivity type regions each having an upper surface which is entirely covered with a region of the Schottky junction of the semiconductor layer in a thickness direction the semiconductor layer.

28. The diode according to claim 27, wherein
the Zener diode region is formed in an annular shape,
the plurality of second conductivity type regions are disposed in a region surrounded by the annular shape of the Zener diode region, and
a portion of the Zener diode region is covered with the Schottky metal and a remaining portion of the Zener diode region is covered with an insulating layer.

* * * * *